(12) United States Patent
Fukuoka et al.

(10) Patent No.: US 12,315,825 B2
(45) Date of Patent: May 27, 2025

(54) SEMICONDUCTOR DEVICE HAVING WIRE PIECES IN BONDING MEMBER

(71) Applicant: DENSO CORPORATION, Kariya (JP)

(72) Inventors: Daisuke Fukuoka, Kariya (JP); Tomomi Okumura, Kariya (JP); Yuuji Ootani, Kariya (JP); Wataru Kobayashi, Kariya (JP); Takumi Nomura, Kariya (JP); Tomoaki Mitsunaga, Kariya (JP); Takahiro Hirano, Kariya (JP); Takamichi Sakai, Kariya (JP); Kengo Oka, Kariya (JP)

(73) Assignee: DENSO CORPORATION, Kariya (JP)

( * ) Notice: Subject to any disclaimer, the term of this patent is extended or adjusted under 35 U.S.C. 154(b) by 472 days.

(21) Appl. No.: 17/708,525

(22) Filed: Mar. 30, 2022

(65) Prior Publication Data

US 2022/0223544 A1 Jul. 14, 2022

Related U.S. Application Data

(63) Continuation of application No. PCT/JP2020/036372, filed on Sep. 25, 2020.

(30) Foreign Application Priority Data

Oct. 4, 2019 (JP) ................ 2019-184066
Sep. 22, 2020 (JP) ................ 2020-158041

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4825* (2013.01); *H01L 23/3107* (2013.01);
(Continued)

(58) Field of Classification Search
CPC .............. H01L 23/562; H01L 21/4825; H01L 23/3107; H01L 23/49513; H01L 23/4952;
(Continued)

(56) References Cited

U.S. PATENT DOCUMENTS 5,847,445 A * 12/1998 Wark ...................... H01L 24/48
257/E23.125
2003/0155645 A1* 8/2003 Ito ...................... H01L 23/49575
257/712
(Continued)

FOREIGN PATENT DOCUMENTS

JP H03-097234 A 4/1991
JP 3347279 B2 11/2002
(Continued)

*Primary Examiner* — Duy T Nguyen
(74) *Attorney, Agent, or Firm* — Posz Law Group, PLC

(57) ABSTRACT

In a semiconductor device, a semiconductor element has a front electrode and a back electrode. The back electrode is connected to a wiring member through a bonding member. Wire pieces are disposed in the bonding member, and bonded to a bonding surface of the wiring member to protrude toward the semiconductor element. The bonding member has, in a plan view, a central region that overlaps with a central portion of the semiconductor element including an element center, and an outer peripheral region that includes a portion overlapping with an outer peripheral portion of the semiconductor element surrounding the central portion and surrounds the central region. At least four wire pieces are disposed in the outer peripheral region at positions corresponding to at least four respective corners of the semiconductor element. At least one wire piece is disposed to extend toward the element center in the plan view.

9 Claims, 18 Drawing Sheets

(51) Int. Cl.
  *H01L 23/31* (2006.01)
  *H01L 23/495* (2006.01)
  *H02P 27/06* (2006.01)

(52) U.S. Cl.
  CPC .... *H01L 23/49513* (2013.01); *H01L 23/4952* (2013.01); *H01L 23/49562* (2013.01); *H01L 23/49568* (2013.01); *H01L 23/49575* (2013.01); *H02P 27/06* (2013.01)

(58) Field of Classification Search
  CPC ......... H01L 23/49562; H01L 23/49568; H01L 23/051; H01L 23/4334; H01L 23/49541; H01L 23/49537; H01L 2224/0603; H01L 2224/32245; H01L 2224/48247; H01L 2224/73265; H01L 2224/8314; H01L 2224/83192; H01L 25/07; H01L 25/18; H01L 24/45; H01L 24/43; H01L 2224/431; H01L 2224/4501; H02P 27/06
  USPC ........................................................ 257/139
  See application file for complete search history.

(56) References Cited

U.S. PATENT DOCUMENTS

| | | | | |
|---|---|---|---|---|
| 2007/0018338 | A1* | 1/2007 | Hosseini | H01L 24/78 |
| | | | | 257/784 |
| 2009/0014894 | A1* | 1/2009 | Ishida | H01L 24/48 |
| | | | | 257/777 |
| 2009/0032972 | A1* | 2/2009 | Okubo | H01L 24/85 |
| | | | | 257/E23.116 |
| 2013/0307130 | A1* | 11/2013 | Oga | H01L 24/40 |
| | | | | 257/666 |
| 2016/0304992 | A1 | 10/2016 | Kurata et al. | |

FOREIGN PATENT DOCUMENTS

| | | |
|---|---|---|
| JP | 2007-311577 A | 11/2007 |
| JP | 2008-153432 A | 7/2008 |
| JP | 2016-111111 A | 6/2016 |
| WO | 2012/081167 A1 | 6/2012 |
| WO | 2017/187998 A1 | 11/2017 |
| WO | WO20171187998 * | 11/2017 |

* cited by examiner

SEMICONDUCTOR DEVICE HAVING WIRE PIECES IN BONDING MEMBER

CROSS REFERENCE TO RELATED APPLICATIONS

The present application is a continuation application of International Patent Application No. PCT/JP2020/036372 filed on Sep. 25, 2020, which designated the U.S. and claims the benefit of priority from Japanese Patent Application No. 2019-184066 filed on Oct. 4, 2019 and Japanese Patent Application No. 2020-158041 filed on Sep. 22, 2020. The entire disclosures of all of the above applications are incorporated herein by reference.

TECHNICAL FIELD

The present disclosure relates to a semiconductor device.

BACKGROUND

JP 5510623 B1 describes to use a Ni ball to ensure a solder thickness. The contents of JP 5510623 B1 are incorporated by reference as a description of technical elements of the present disclosure.

SUMMARY

The present disclosure describes a semiconductor device including a semiconductor element having main electrodes on both sides, a bonding member, a wiring member, and a plurality of wire pieces. The bonding member is disposed between a first facing surface and a second surface, each of which are provided by the semiconductor element or the wiring member, to form a bonding part. The wiring member is electrically connected to at least one of the main electrodes through the bonding member. The wire pieces are disposed in the bonding member, and fixed to the first facing surface to protrude from the first facing surface toward the second facing surface.

BRIEF DESCRIPTION OF DRAWINGS

Objects, features and advantages of the present disclosure will become more apparent from the following detailed description made with reference to the accompanying drawings, in which.

DETAILED DESCRIPTION

Figure 1:
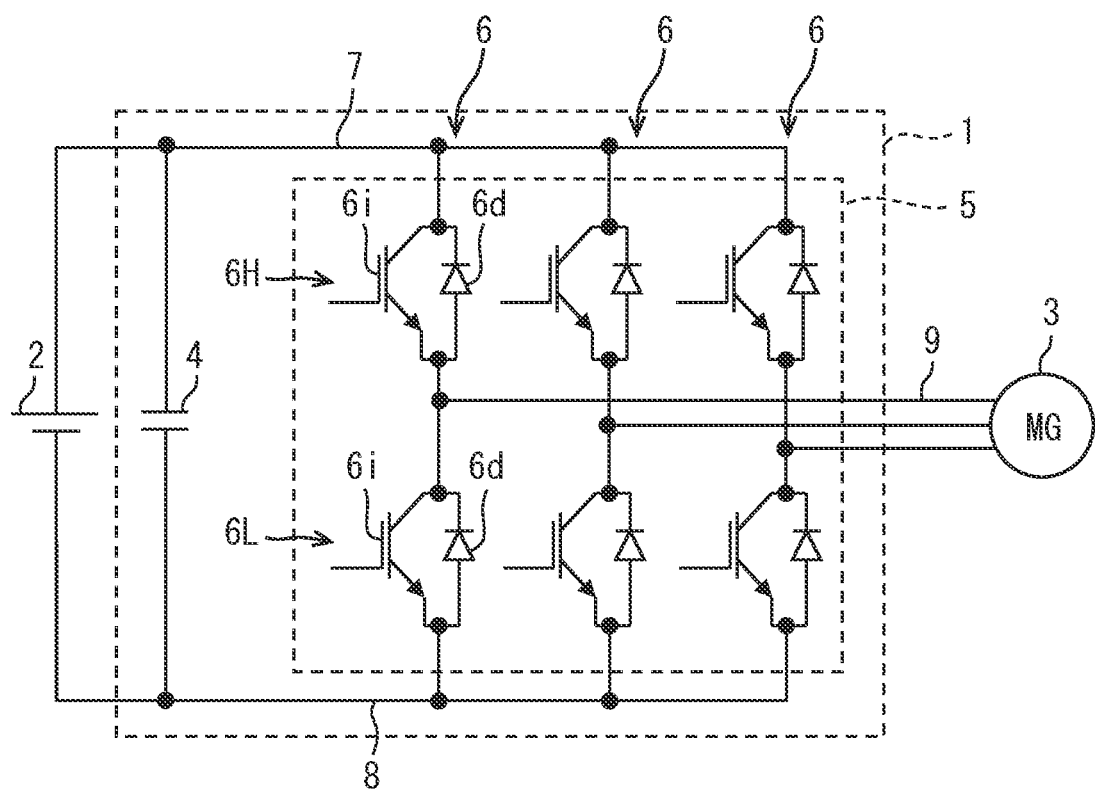
FIG. 1 is a circuit diagram of a power conversion device to which a semiconductor device according to a first embodiment is applied.

It is known to use a Ni ball to ensure a solder thickness in a semiconductor device. However, the application target of the Ni ball is limited. For example, in the case of solder die bonding, the Ni ball melts in no small amount in a solder melting furnace. Hence there is a possibility that the minimum ensured thickness of the solder (bonding member) cannot be ensured. From such a viewpoint or from other viewpoints not mentioned, further improvement is required for the semiconductor device.

The present disclosure provides a semiconductor device which has high reliability.

According to an aspect of the present disclosure, a semiconductor device includes a semiconductor element, a bonding member, a wiring member, and a plurality of wire pieces. The semiconductor element has a front surface and a back surface opposite to the front surface in a plate thickness direction of the semiconductor element. The semiconductor element includes, as main electrodes, a front electrode on the front surface and a back electrode on the back surface, and the back electrode has an area larger than an area of the front electrode. The bonding member is disposed between a first facing surface and a second facing surface to form a bonding part. The wiring member is electrically connected to at least one of the main electrodes through the bonding member. The plurality of wire pieces are disposed in the bonding member, and fixed to the first facing surface to protrude from the first facing surface. The wiring member includes a back-side wiring member disposed adjacent to the back surface of the semiconductor element and electrically connected to the back electrode. The bonding member includes a back-side bonding member that forms a bonding part between the back electrode and the back-side wiring member. The back-side bonding member has, in a plan view in the plate thickness direction, a central region that overlaps with a central portion of the semiconductor element including an element center, and an outer peripheral region that includes a portion overlapping with an outer peripheral portion of the semiconductor element surrounding the central portion and surrounds the central region. The plurality of wire pieces include at least four wire pieces disposed in the outer peripheral region of the back-side bonding member at positions corresponding to at least four respective corners of the semiconductor element. The plurality of wire pieces include at least one wire piece disposed to extend toward the element center in the plan view.

According to the semiconductor device described above, the wire pieces are fixed to the first facing surface. The thickness of the bonding member can be ensured by the wire pieces protruding from the first facing surface. Even when the semiconductor element having the main electrodes on both surfaces has warped, the thickness of the bonding member can be ensured by the wire pieces provided in the outer peripheral region. The wire piece extending toward the element center hardly obstructs the flow when the solder wets and spreads. As described above, a highly reliable semiconductor device can be provided.

Hereinafter, a plurality of embodiments will be described with reference to the drawings. In the plurality of embodiments, functionally and/or structurally corresponding and/or associated portions may be provided with the same reference numerals. For the corresponding and/or associated portions, reference may be made to descriptions of other embodiments.

First Embodiment

First, an example of a power conversion device to which a semiconductor device is applied will be described with reference to FIG. 1.

<Power Conversion Device>

A power conversion device 1 illustrated in FIG. 1 is mounted on, for example, an electric vehicle or a hybrid vehicle. The power conversion device 1 performs power conversion between a direct current (DC) power supply 2 and the motor generator 3. The power conversion device 1 constitutes a drive system of a vehicle together with the DC power supply 2 and the motor generator 3.

The DC power supply 2 is a chargeable/dischargeable secondary battery such as a lithium-ion battery or a nickel-hydrogen battery. The motor generator 3 is a three-phase alternating current (AC) rotating electrical machine. The motor generator 3 functions as a traveling drive source of the vehicle, that is, an electric motor. The motor generator 3 functions as a generator during regeneration.

The power conversion device 1 includes a smoothing capacitor 4 and an inverter 5 that is a power converter. A positive electrode side terminal of the smoothing capacitor 4 is connected to a positive electrode that is an electrode on a high potential side of the DC power supply 2, and a negative electrode side terminal is connected to a negative electrode that is an electrode on a low potential side of the DC power supply 2. The inverter 5 converts the input DC power into a three-phase AC of a predetermined frequency and outputs the three-phase AC to the motor generator 3. The inverter 5 converts AC power generated by the motor generator 3 into DC power. The inverter 5 is a DC to AC converter.

The inverter 5 includes upper and lower arm circuits 6 for three phases. The upper and lower arm circuit 6 may be referred to as a leg. The upper and lower arm circuit 6 of each phase is formed by connecting two arms 6H, 6L in series between a high-potential power supply line 7, which is a power supply line on the positive electrode side, and a low-potential power supply line 8, which is a power supply line on the negative electrode side. In the upper and lower arm circuit 6 of each phase, a connection point between the upper arm 6H and the lower arm 6L is connected to an output line 9 to the motor generator 3.

In the present embodiment, an n-channel insulated-gate bipolar transistor 6i (hereinafter referred to as an IGBT 6i) is adopted as a switching element constituting each arm. A freewheeling diode (FWD) 6d, which is a reflux diode, is connected in anti-parallel to each IGBT 6i. The upper and lower arm circuit 6 for one phase includes two IGBTs 6i. In the upper arm 6H, the collector electrode of the IGBT 6i is connected to the high-potential power supply line 7. In the lower arm 6L, the emitter electrode of the IGBT 6i is connected to the low-potential power supply line 8. The emitter electrode of the IGBT 6i in the upper arm 6H and the collector electrode of the IGBT 6i in the lower arm 6L are connected to each other.

In addition to the smoothing capacitor 4 and the inverter 5 described above, the power conversion device 1 may include a converter that is a power converter different from the inverter 5, a drive circuit of a switching element constituting each of the inverter 5 and the converter, a filter capacitor, and the like. The converter is a DC-DC converter that converts a DC voltage into a DC voltage having a different value. The converter is provided between the DC power supply 2 and the smoothing capacitor 4. The filter capacitor is connected in parallel to the DC power supply 2. The filter capacitor removes, for example, power supply noise from the DC power supply 2.

<Semiconductor Device>

Figure 2:
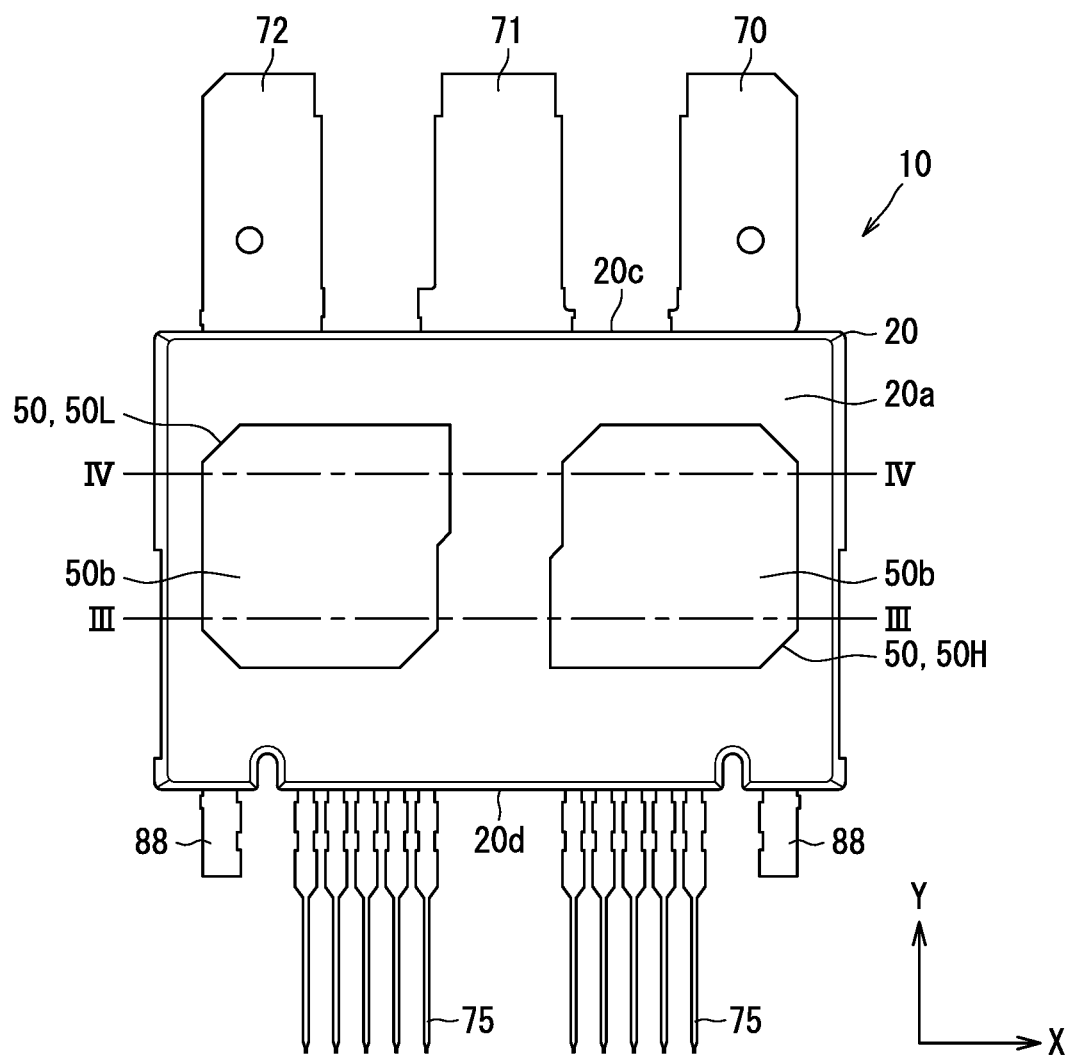
FIG. 2 is a plan view of a semiconductor device.
Figure 3:
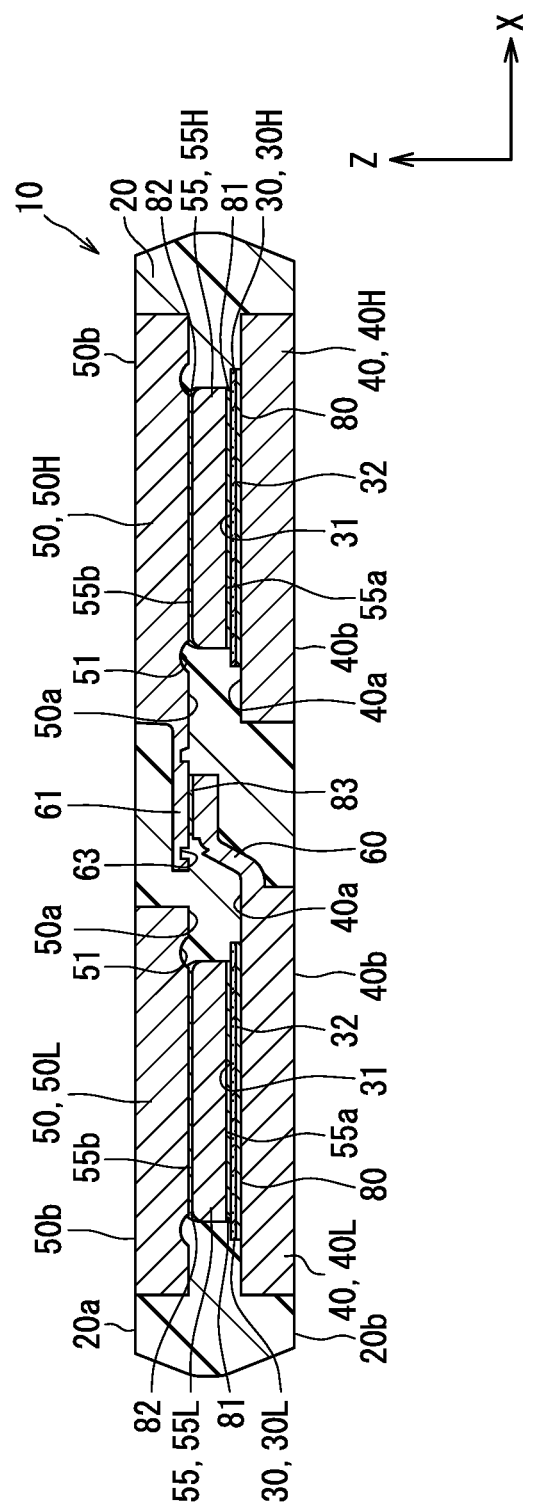
FIG. 3 is a sectional view taken along a line III-III of FIG. 2.
Figure 4:
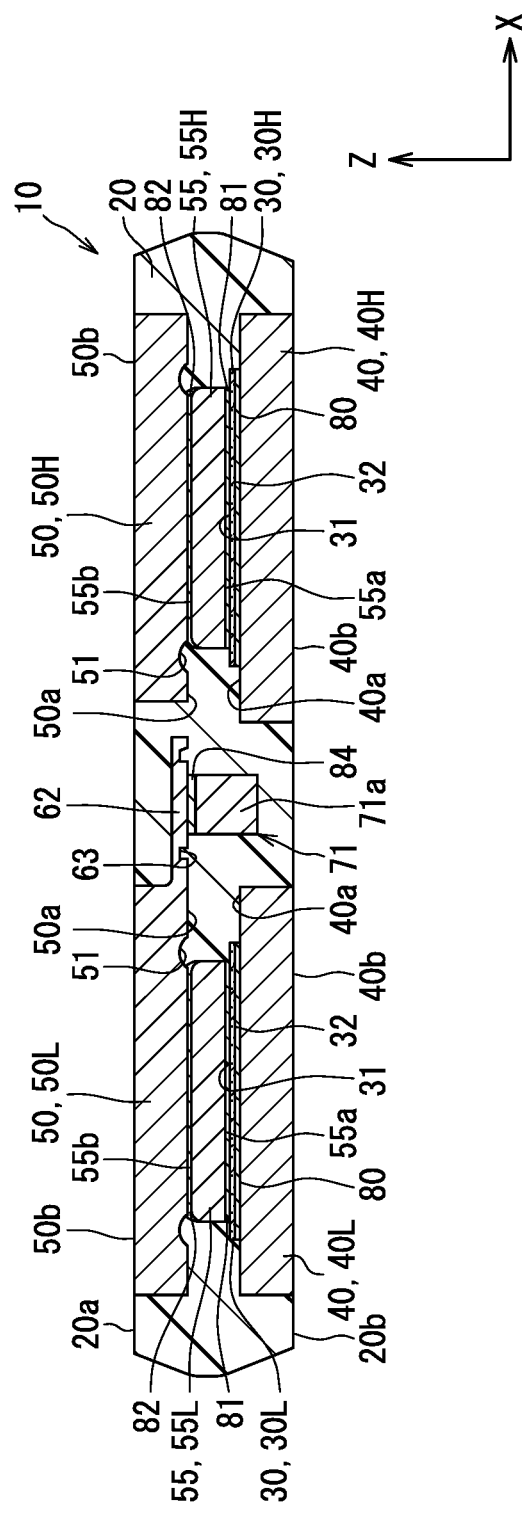
FIG. 4 is a sectional view taken along a line IV-IV of FIG. 2.
Figure 5:
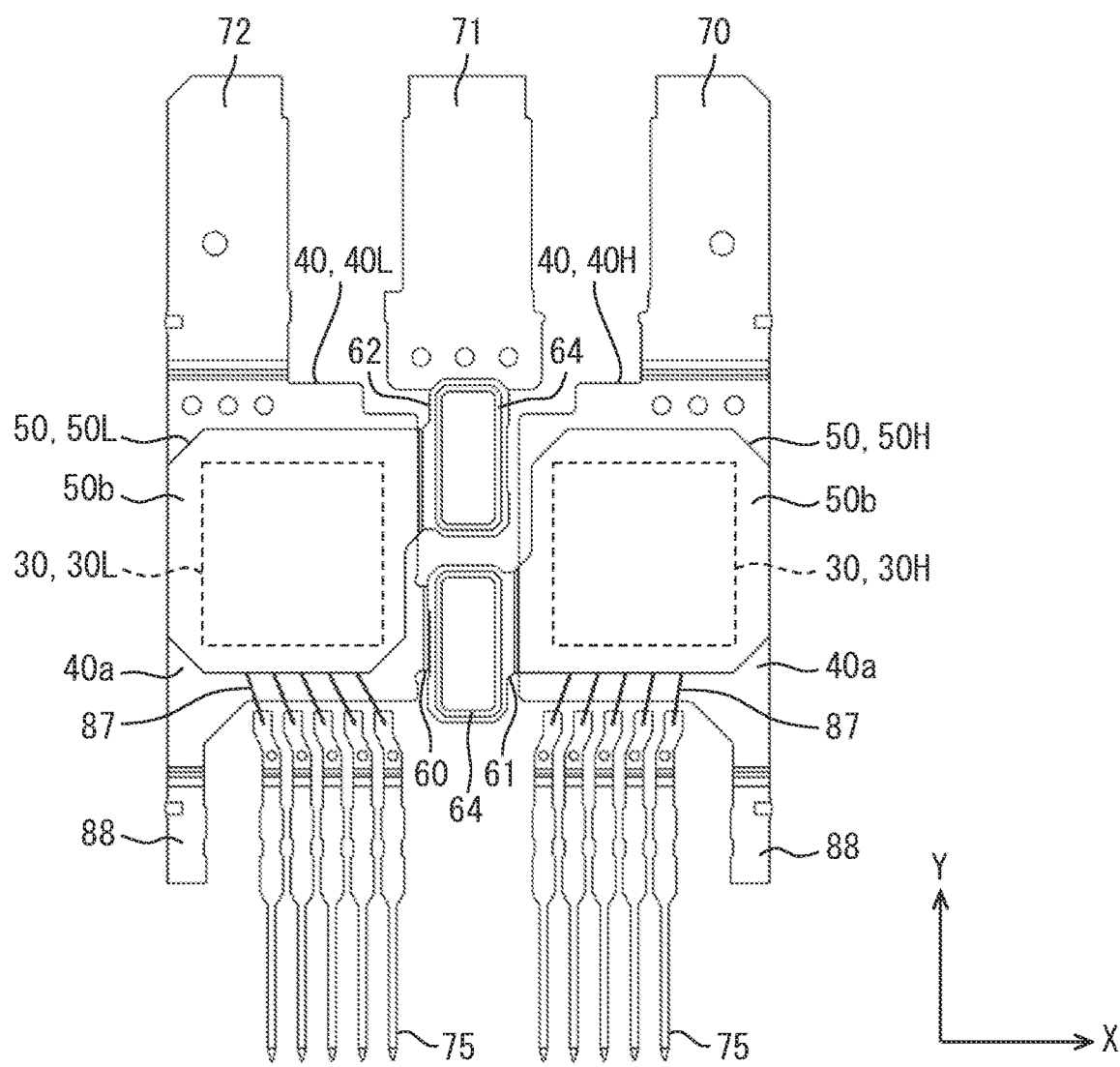
FIG. 5 is a plan view in which a sealing resin body is omitted.
Figure 6:
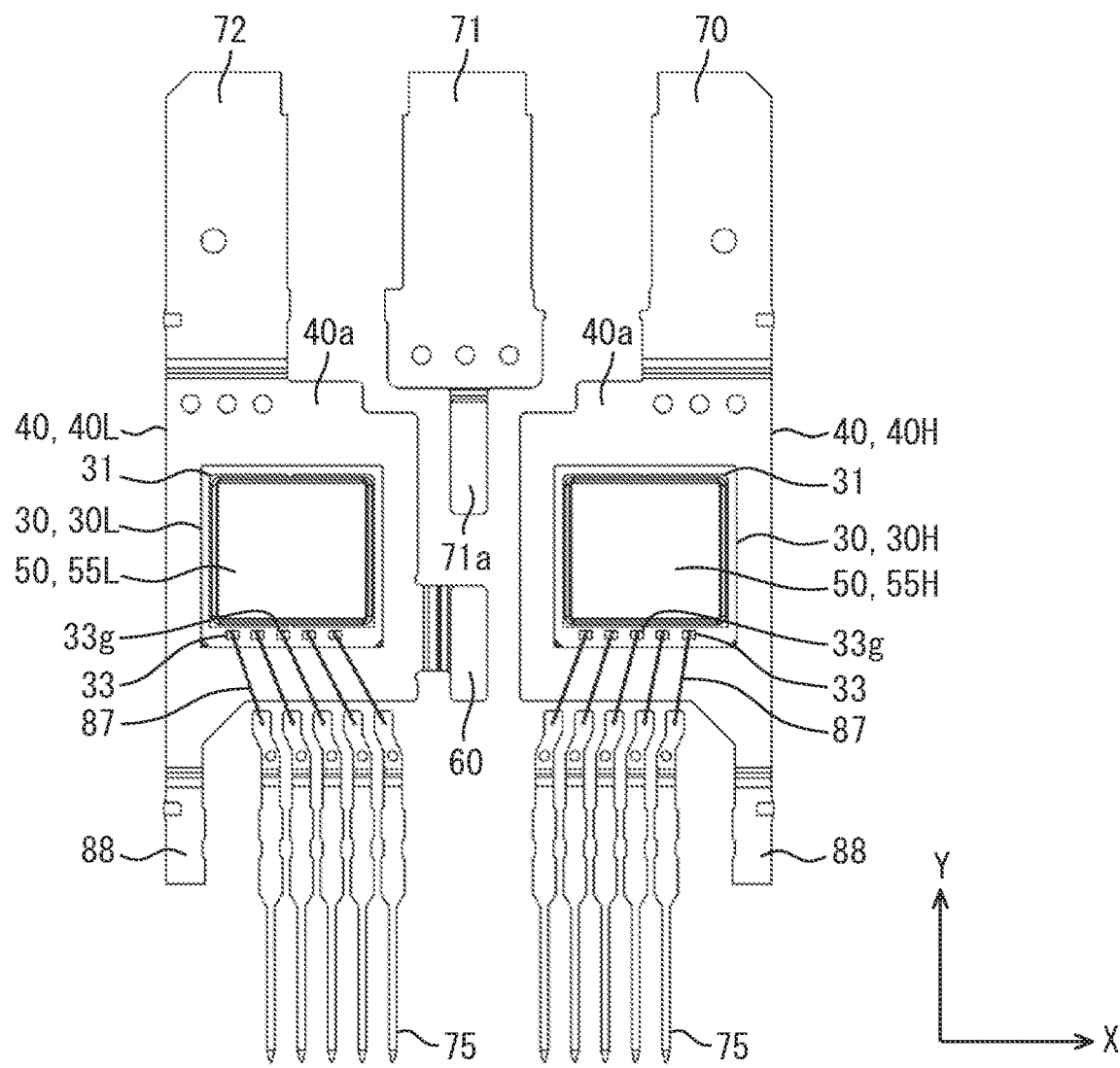
FIG. 6 is a plan view in which a heatsink on an emitter electrode side is omitted.

Next, an example of the semiconductor device will be described with reference to FIGS. 2 to 6. FIGS. 3 and 4 are sectional views taken along lines III-III and IV-IV in FIG. 2. FIG. 5 is a view in which a sealing resin body is omitted from FIG. 2. FIG. 6 is a diagram in which a heatsink on the emitter electrode side is omitted from FIG. 5. "H" indicating the upper arm 6H side and "L" indicating the lower arm 6L side are added to the end of the reference numerals of some of the elements constituting the semiconductor device. For the sake of convenience, reference numerals that are common between the upper arm 6H and the lower arm 6L are given to some others of the elements.

Hereinafter, a plate thickness direction of a semiconductor element is referred to as a Z-direction, one direction orthogonal to the Z-direction, specifically, an arrangement direction of two semiconductor elements, is referred to as an X-direction. Further, a direction orthogonal to both the Z-direction and the X-direction is indicated as a Y-direction. Unless otherwise specified, a shape in a plan view from the Z-direction, in other words, a shape along the XY plane defined by the X-direction and the Y-direction, is a planar shape. The plan view from the Z-direction is simply referred to as a plan view.

As illustrated in FIGS. 2 to 6, a semiconductor device 10 includes a sealing resin body 20, a semiconductor element 30, a heatsink 40, a heatsink 50, a terminal 55, couplings 60 to 62, main terminals 70 to 72, and a signal terminal 75. The semiconductor device 10 constitutes the upper and lower arm circuit 6 for one phase described above.

The sealing resin body 20 seals a part of each of other elements constituting the semiconductor device 10. The remaining portions of the other elements are exposed to the outside of the sealing resin body 20. The sealing resin body 20 is made of, for example, epoxy resin. The sealing resin body 20 is molded by, for example, a transfer molding method. As illustrated in FIGS. 2 to 4, the sealing resin body 20 has a substantially rectangular planar shape. The sealing resin body 20 has a front surface 20a and a back surface 20b opposite to the front surface 20a in the Z-direction. The front surface 20a and the back surface 20b are, for example, flat surfaces.

The semiconductor element 30 is formed by forming an element on a semiconductor substrate made of silicon (Si), a wide-bandgap semiconductor having a wider bandgap than silicon, or the like. Examples of the wide-bandgap semiconductor include silicon carbide (SiC), gallium nitride (GaN), gallium oxide ($Ga_2O_3$), and diamond. The semiconductor element 30 may be referred to as a semiconductor chip.

The element has a vertical structure such that a main current flows in the Z-direction. As a vertical element, an IGBT, a metal-oxide-semiconductor field-effect transistor (MOSFET), a diode, or the like can be adopted. In the present embodiment, the IGBT 6i and the FWD 6d constituting one arm are formed as the vertical elements. The vertical element is a reverse conducting (RC)-IGBT. The semiconductor element 30 has a gate electrode (not illustrated). The gate electrode has, for example, a trench structure. The semiconductor element 30 has main electrodes of the element on both surfaces in the plate thickness direction thereof, that is, the Z-direction. Specifically, as the main electrodes, an emitter electrode 31 is provided on the front surface side, and a collector electrode 32 is provided on the back surface side. The emitter electrode 31 also serves as the anode electrode of the FWD 6d. The collector electrode 32 also serves as the cathode electrode of the FWD 6d. The emitter electrode 31 corresponds to a front electrode, and the collector electrode 32 corresponds to a back electrode.

The semiconductor element 30 has a substantially rectangular planar shape. As illustrated in FIG. 6, the semiconductor element 30 has a pad 33 formed at a position different from the emitter electrode 31 on the front surface. The emitter electrode 31 and the pad 33 are exposed from a protective film (not illustrated) on the front surface of the semiconductor substrate. The emitter electrode 31 is formed on a portion of the front surface of the semiconductor element 30. The collector electrode 32 is formed on substantially the entire back surface. In a plan view, the collector electrode 32 is larger in area than the emitter electrode 31.

The pad 33 is an electrode for a signal. The pad 33 is electrically separated from the emitter electrode 31. The pad 33 is formed at an end opposite to the formation region of the emitter electrode 31 in the Y-direction. The pad 33 includes a gate pad 33g for the gate electrode. In the present embodiment, the semiconductor element 30 has five pads 33. Specifically, the semiconductor element 30 has the gate pad 33g described above, a pad for a Kelvin emitter that detects the potential of the emitter electrode 31, a pad for current sensing, a pad for an anode potential of a temperature sensor (thermosensitive diode) that detects the temperature of the semiconductor element 30, and a pad for a cathode potential of the temperature sensor. The five pads 33 are collectively formed on one end side in the Y-direction and are formed side by side in the X-direction in the semiconductor element 30 having a substantially rectangular planar shape.

The semiconductor device 10 includes two semiconductor elements 30. Specifically, a semiconductor element 30H constituting the upper arm 6H and a semiconductor element 30L constituting the lower arm 6L are provided. The semiconductor elements 30H, 30L configurations similar to each other. The semiconductor elements 30H, 30L are arranged in the X-direction. The semiconductor elements 30H, 30L are disposed at substantially the same position in the Z-direction.

The heatsink 40 is a wiring member disposed on the back surface side of the semiconductor element 30 in the Z-direction and electrically connected to the collector electrode 32 via solder 80. The solder 80 connects (bonds) the heatsink 40 and the collector electrode 32. The heatsink 40 corresponds to a back-side wiring member, and the solder 80 corresponds to a back-side bonding member. The heatsink 40 has a mounting surface 40a, which is a surface facing the semiconductor element 30, and a back surface 40b, which is a surface opposite to the mounting surface 40a. The solder 80 is interposed between a mounting surface 40a of the heatsink 40 and the collector electrode 32 of the semiconductor element 30 to form a solder bonding part.

The heatsink 40 dissipates the heat of the semiconductor element 30 to the outside. As the heatsink 40, for example, a metal plate made of Cu, a Cu alloy, or the like, a direct bonded copper (DBC) substrate, or the like can be adopted. The heatsink 40 may have a plating film of Ni, Au, or the like on the surface. In the present embodiment, the heatsink 40 is a metal plate made of Cu. The heatsink 40 may be referred to as a heat dissipation member, a conductive member, or a lead frame. The semiconductor device 10 includes two heatsinks 40. Specifically, a heatsink 40H constituting the upper arm 6H and a heatsink 40L constituting the lower arm 6L are provided.

As illustrated in FIG. 6, each of the heatsinks 40H, 40L has a substantially rectangular planar shape. The heatsinks 40H, 40L are arranged in the X-direction. As illustrated in FIGS. 3 and 4, the heatsinks 40H, 40L have substantially the same thickness and are disposed at substantially the same position in the Z-direction. Solder bonding parts are formed between the mounting surface 40a of the heatsink 40H and the collector electrode 32 of the semiconductor element 30H and between the mounting surface 40a of the heatsink 40L and the collector electrode 32 of the semiconductor element 30L.

The heatsinks 40H, 40L enclose the corresponding semiconductor element 30 in a plan view from the Z-direction. The back surfaces 40b of the heatsinks 40H, 40L are exposed from the sealing resin body 20. The back surface 40b may be referred to as a heat dissipation surface or an exposed surface. The back surface 40b is substantially flush with the back surface 20b of the sealing resin body 20. The back surfaces 40b of the heatsinks 40H, 40L are arranged in the X-direction.

The heatsink 50 and the terminal 55 are wiring members disposed on the front surface side of the semiconductor element 30 in the Z-direction and electrically connected to the emitter electrode 31 via the solder 81 and solder 82. The terminal 55 is interposed between the semiconductor element 30 and the heatsink 50 in the Z-direction. The solder 81 connects (joins) the terminal 55 and the emitter electrode 31. The solder 82 connects (joins) the heatsink 50 and the terminal 55.

The terminal 55 has a first end face 55a, which is a surface facing the semiconductor element 30, and a second end face 55b, which is a surface opposite to the first end face 55a. The heatsink 50 has a mounting surface 50a, which is a surface facing the second end face 55b, and a back surface 50b, which is a surface opposite to the mounting surface 50a. The mounting surface 50a is a surface of the heatsink 50 on the semiconductor element 30 side. The solder 81 is interposed between the first end face 55a of the terminal 55 and the emitter electrode 31 of the semiconductor element 30 to form a solder bonding part. The solder 82 is interposed between the second end face 55b of the terminal 55 and the mounting surface 50a of the heatsink 50 to form a solder bonding part. The heatsink 50 and the terminal 55 correspond to the front-side wiring member. The solder 81 corresponds to a front-side bonding member.

The terminal 55 is located in the middle of an electrical conduction and thermal conduction path between the semiconductor element 30 (emitter electrode 31) and the heatsink 50. The terminal 55 contains a metal material such as Cu or a Cu alloy. A plating film may be provided on the surface. Each of the terminals 55H, 55L is a columnar body that is substantially as large as the emitter electrode 31 and has a substantially rectangular planar shape in a plan view. The terminal 55 may be referred to as a metal block body or a relay member. The semiconductor device 10 includes two terminals 55. Specifically, a terminal 55H constituting the upper arm 6H and a terminal 55L constituting the lower arm 6L are provided. Solder bonding parts are formed between the first end face 55a of the terminal 55H and the emitter electrode 31 of the semiconductor element 30H and between the first end face 55a of the terminal 55L and the emitter electrode 31 of the semiconductor element 30L.

The heatsink 50 dissipates the heat of the semiconductor element 30 to the outside. The heatsink 50 has a similar configuration to that of the heatsink 40. In the present embodiment, the heatsink 50 is a metal plate made of Cu. The semiconductor device 10 includes two heatsinks 50. Specifically, a heatsink 50H constituting the upper arm 6H and a heatsink 50L constituting the lower arm 6L are provided.

As illustrated in FIG. 5, the heatsinks 50H, 50L each have a substantially rectangular planar shape. The heatsinks 50H, 50L are arranged in the X-direction. As illustrated in FIGS. 3 and 4, the heatsinks 50H, 50L have substantially the same thickness and are disposed at substantially the same position in the Z-direction. Solder bonding parts are formed between the mounting surface 50a of the heatsink 50H and the second end face 55b of the terminal 55H, and between the mounting surface 50a of the heatsink 50L and the second end face 55b of the terminal 55L.

The heatsinks 50H, 50L enclose the corresponding semiconductor element 30 and terminal 55 in a plan view from the Z-direction. On the mounting surfaces 50a of the heatsinks 50H, 50L, a groove 51 for holding the overflowing solder 82 is formed. The groove 51 surrounds the solder bonding part on the mounting surface 50a. The groove 51 is formed in, for example, an annular shape. The back surfaces 50b of the heatsinks 50H, 50L are exposed from the sealing resin body 20. The back surface 50b may be referred to as a heat dissipation surface or an exposed surface. The back surface 50b is substantially flush with the front surface 20a of the sealing resin body 20. The back surfaces 50b of the heatsinks 50H, 50L are arranged in the X-direction.

The couplings 60 to 62 couples between elements constituting the upper and lower arm circuit 6. The coupling couples between elements constituting the semiconductor device 10. As illustrated in FIGS. 3 and 6, the coupling 60 is continuous with the heatsink 40L. The coupling 60 is thinner than the heatsink 40L. The coupling 60 is continuous with a surface (side surface) facing the heatsink 40H in the state of being substantially flush with the mounting surface 40a of the heatsink 40L. The coupling 60 has a substantially crank shape in the ZX plane by having two bent parts. The coupling 60 is covered with the sealing resin body 20. The coupling 60 may be continuous with the heatsink 40L by being provided integrally, or may be continuous with the heatsink 40L by connection while being provided separately. In the present embodiment, the coupling 60 is provided integrally with the heatsink 40L as a part of the lead frame.

As illustrated in FIGS. 3 and 5, the couplings 61, 62 are continuous with the corresponding heatsinks 50. The coupling 61 is continuous with the heatsink 50H. The coupling 62 is continuous with the heatsink 50L. The couplings 61, 62 are thinner than the corresponding heatsink 50. The couplings 61, 62 are covered with a sealing resin body 20. Each of the couplings 61, 62 may be continuous with the heatsink 50 by being provided integrally, or may be continuous with the heatsink 50 by connection while being provided separately. In the present embodiment, the couplings 61, 62 are provided integrally with the corresponding heatsinks 50H, 50L. The couplings 61, 62 extend in the X-direction from the side surfaces facing each other in the two heatsinks 50H, 50L.

The heatsink 50H including the coupling 61 and the heatsink 50L including the coupling 62 are common members. The heatsink 50H including the coupling 61 and the heatsink 50L including the coupling 62 are disposed in two-fold rotational symmetry with the Z-axis as a rotation axis. Solder 83 is interposed between the facing surfaces of the coupling 60 and the coupling 61 to form a solder bonding part.

A groove 63 for holding the overflowing solder 83 is formed on the bonding surface of the coupling 61. The groove 63 is formed in an annular shape so as to surround the solder bonding part. Similarly, a groove 63 for holding the overflowing solder is also formed on the bonding surface of the coupling 62. In the present embodiment, the groove 63 is formed by press working. Therefore, each of the couplings 61, 62 have a protrusion 64 on the back surface side of the groove 63.

The main terminals 70 to 72 and the signal terminal 75 are external connection terminals. The main terminals 70, 71 are power supply terminals. The main terminal 70 is electrically connected to the positive electrode terminal of the smoothing capacitor 4. The main terminal 71 is electrically connected to the negative electrode terminal of the smoothing capacitor 4. Therefore, the main terminal 70 may be referred to as a P terminal, and the main terminal 71 may be referred to as an N terminal.

As illustrated in FIGS. 5 and 6, the main terminal 70 is continuous with one end of the heatsink 40H in the Y-direction. The main terminal 70 is thinner than the heatsink 40H. The main terminal 70 is substantially flush with the mounting surface 40a and continuous with the heatsink 40H. The main terminal 70 extends in the Y-direction from the heatsink 40H and protrudes outward from the side surface 20c of the sealing resin body 20. The main terminal 70 has a bent part in the middle of a portion covered with the sealing resin body 20 and protrudes from the vicinity of the center in the Z-direction on the side surface 20c.

As illustrated in FIGS. 4 and 5, the main terminal 71 is connected to the coupling 62. Solder 84 is interposed between the facing surfaces of the main terminal 71 and the coupling 62 to form a solder bonding part. The main terminal 71 extends in the Y-direction and protrudes from the same side surface 20c as the main terminal 70 to the outside of the sealing resin body 20. The main terminal 71 has a connection part 71a with the coupling 62 near one end in the Y-direction. A portion of the main terminal 71 including the connection part 71a is covered with the sealing resin body 20, and the remaining part protrudes from the sealing resin body 20. The connection part 71a is thicker than a portion protruding from the sealing resin body 20. The plate thickness of the connection part 71a is substantially the same as the thickness of the heatsink 40, for example. The main terminal 71 also has a bent part similarly to the main terminal 71 and protrudes from the vicinity of the center in the Z-direction on the side surface 20c.

The main terminal 72 is connected to a connection point between the upper arm 6H and the lower arm 6L. The main terminal 72 is electrically connected to a winding (stator coil) of a corresponding phase of the motor generator 3. The main terminal 72 is also referred to as an output terminal, an AC terminal, or an O terminal. The main terminal 72 is continuous with one end of the heatsink 40L in the Y-direction. The main terminal 72 is thinner than the heatsink 40L. The main terminal 72 is substantially flush with the mounting surface 40a and continuous with the heatsink 40L. The main terminal 72 extends from the heatsink 40L in the Y-direction and protrudes from the same side surface 20c as the main terminal 70 to the outside of the sealing resin body 20. The main terminal 72 also has a bent part similarly to the main terminal 71 and protrudes from the vicinity of the center in the Z-direction on the side surface 20c. The three main terminals 70 to 72 are disposed in the order of the main terminal 70, the main terminal 71, and the main terminal 72 in the X-direction.

The signal terminal 75 is electrically connected to the pad 33 of the corresponding semiconductor element 30. In the present embodiment, the electrical connection is made via a bonding wire 87. The signal terminal 75 extends in the Y-direction and protrudes outward from the side surface 20d of the sealing resin body 20. The side surface 20d is a surface opposite to the side surface 20c in the Y-direction. In the present embodiment, five signal terminals 75 are provided for one semiconductor element 30.

Reference numeral 88 illustrated in FIGS. 2, 5, and 6 denotes a suspension lead. The heatsink 40 (40H, 40L), the coupling 60, the main terminals 70 to 72, and the signal terminal 75 are formed in a lead frame that is a common member. The lead frame is a counter stripe having a partially different thickness. The signal terminal 75 is connected to the suspension lead 88 via a tie bar in a state before cutting. An unnecessary portion of the lead frame such as the tie bar is cut (removed) after the molding of the sealing resin body 20.

As described above, in the semiconductor device 10, the plurality of semiconductor elements 30 constituting the upper and lower arm circuit 6 for one phase are sealed by the sealing resin body 20. The sealing resin body 20 integrally seals a part of each of the plurality of semiconductor elements 30 and the heatsink 40, a part of each of the heatsink 50, and a part of each of the terminal 55, the couplings 60 to 62, the main terminals 70 to 72, and the signal terminal 75.

In the Z-direction, the semiconductor element 30 is disposed between the heatsinks 40, 50. Thereby, the heat of the semiconductor element 30 can be dissipated to both sides in the Z-direction. The semiconductor device 10 has a double-sided heat dissipation structure. The back surface 40b of the heatsink 40 is substantially flush with the back surface 20b of the sealing resin body 20. The back surface 50b of the heatsink 50 is substantially flush with the front surface 20a of the sealing resin body 20. Since the back surfaces 40b, 50b are exposed surfaces, heat dissipation can be enhanced.

<Wire Piece>

Figure 7:
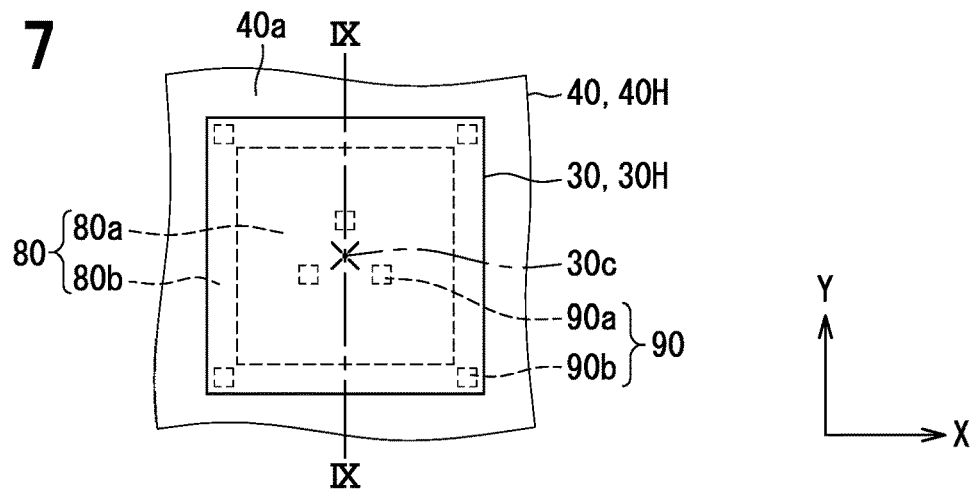
FIG. 7 is a plan view illustrating a positional relationship between a semiconductor element and wire pieces.
Figure 8:
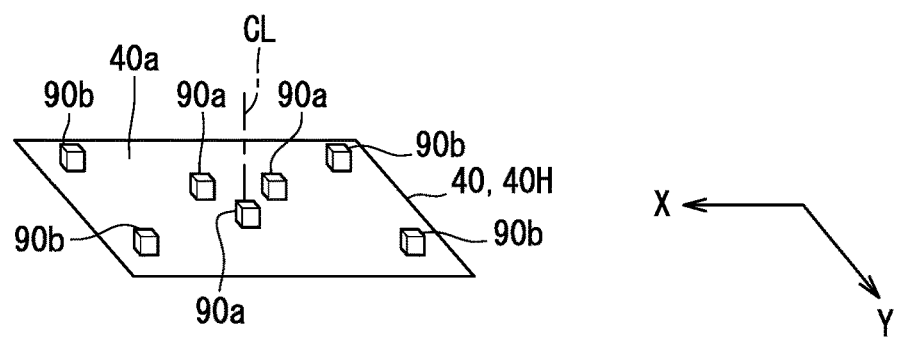
FIG. 8 is a perspective view illustrating an arrangement of wire pieces.
Figure 9:
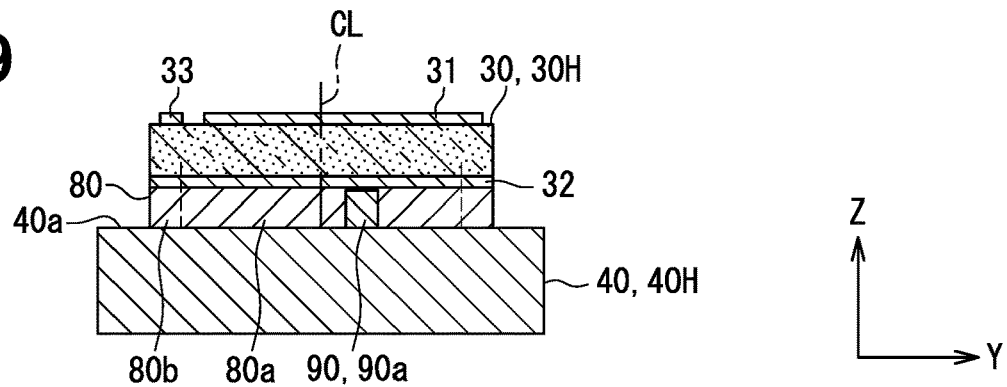
FIG. 9 is a sectional view taken along a line IX-IX of FIG. 7.

Next, wire pieces will be described with reference to FIGS. 7 to 9. FIG. 7 is an enlarged plan view of the periphery of the semiconductor element 30H on the upper arm 6H side in FIG. 6. FIG. 7 illustrates a positional relationship between the semiconductor element and the wire pieces. In FIG. 7, the terminal 55H, the solder 81, the emitter electrode 31, the pad 33, and the bonding wire 87 are omitted for convenience. FIG. 8 is a perspective view illustrating an arrangement of wire pieces. FIG. 9 is a sectional view taken along a line IX-IX of FIG. 7.

As illustrated in FIGS. 7 to 9, the semiconductor device 10 further includes wire pieces 90. The wire piece 90 is provided in at least one of the solder bonding parts each electrically connecting the main electrode and the wiring member. The wire piece 90 is disposed in the solder. A plurality of wire pieces 90 are dispersedly arranged for one (single) solder. The plurality of wire pieces 90 are fixed (bonded) to a first facing surface that is one of facing surfaces constituting the solder bonding part, and protrude toward a second facing surface that is another one of the facing surfaces.

The wire piece 90 has a predetermined height in order to ensure the minimum film thickness of the solder. Even in a state where the plurality of wire pieces 90 are in contact with the second facing surface, the height of the wire piece 90 is set such that the shortest distance between the first facing surface and the second facing surface is equal to or more than the minimum film thickness. The minimum film thickness is the minimum thickness required for ensuring desired connection reliability. The height of the wire piece 90 is, for example, a value obtained by adding a margin to the minimum film thickness. The wire piece 90 is a small piece of the bonding wire. The wire piece 90 may be referred to as a protruding portion or stud bonding.

In the present embodiment, a plurality of wire pieces 90 are arranged in the solder 80 between the collector electrode 32 of the semiconductor element 30H and the mounting surface 40a of the heatsink 40H. All of the plurality of wire pieces 90 are fixed (bonded) to the mounting surface 40a of the heatsink 40H and are not fixed to the back surface of the semiconductor element 30H, that is, onto the collector electrode 32. The mounting surface 40a of the heatsink 40H corresponds to the first facing surface, and the back surface of the semiconductor element 30H corresponds to the second facing surface. The plurality of wire pieces 90 are fixed to the mounting surface 40a. The wire piece 90 is a small piece of a bonding wire made of aluminum or an aluminum alloy. All the wire pieces 90 fixed to the mounting surface 40a are arranged in the solder 80.

The solder 80 has a central region 80a overlapping with the central portion of the semiconductor element 30H and an outer peripheral region 80b surrounding the central region 80a in a plan view. The central portion of the semiconductor element 30H is an element center 30c and the peripheral portion thereof. The semiconductor element 30H has an outer peripheral portion surrounding a central portion. The outer peripheral portion is, for example, a portion within a predetermined range from each of the four sides of the rectangular planar shape. For example, the central portion is an active region in which an element is formed, and the outer peripheral portion is an outer peripheral withstand voltage region surrounding the active region. The outer peripheral region 80b includes a portion overlapping with the outer peripheral portion of the semiconductor element 30H. A plurality of wire pieces 90 are arranged in each of the central region 80a and the outer peripheral region 80b.

The plurality of wire pieces 90a as some of the wire pieces 90 fixed to the mounting surface 40a are arranged in the central region 80a so as to surround the element center 30c in a plan view. A center line CL illustrated in FIG. 7 is an imaginary line passing through the element center 30c and extending in the Z-direction. The wire pieces 90a in the central region 80a surround the center line CL. In order to surround the element center 30c, three or more wire pieces 90a are arranged in the central region 80a. In the present embodiment, three wire pieces 90a are arranged in the central region 80a. The three wire pieces 90a have a positional relationship of three-fold rotational symmetry with respect to the element center 30c.

A plurality of wire pieces 90b, which are the other of the wire pieces 90 fixed to the mounting surface 40a, are arranged in the outer peripheral region 80b so as to surround the element center 30c in a plan view. The plurality of wire pieces 90b are arranged corresponding to at least the four respective corners of the semiconductor element 30H having a rectangular planar shape. Therefore, four or more wire pieces 90b are arranged in the outer peripheral region 80b. In the present embodiment, four wire pieces 90b are arranged in the outer peripheral region 80b. The wire pieces 90b are arranged at portions overlapping with the four corners of the semiconductor element 30H. The four corners do not refer to four corners (vertexes) of the rectangular planar shape but are portions of a predetermined range including the vertexes (portions around the corners).

A similar configuration is formed on the lower arm 6L side. That is, a plurality of wire pieces 90 are arranged in the solder 80 between the collector electrode 32 of the semiconductor element 30L and the mounting surface 40a of the heatsink 40L. The plurality of wire pieces 90 are fixed to the mounting surface 40a. Therefore, a description is omitted.

<Method for Manufacturing Semiconductor Device>

Next, a method for manufacturing the semiconductor device 10 described above will be described. In the present embodiment, the semiconductor device 10 is formed using a solder die bond method.

First, the wire piece 90 is formed. An aluminum-based bonding wire is ultrasonically bonded to the mounting surface 40a of the heatsink 40 in the lead frame. The bonding wire typically has a first bonding part and a second bonding part in order to electrically connect two portions. Here, the wire is cut at the point when the first bonding part is formed to form the wire piece 90.

Next, molten solder is applied to form a laminate. First, molten solder (solder 80) is applied onto the mounting surface 40a, and the semiconductor element 30 is disposed on the molten solder such that the collector electrode 32 is on the mounting surface 40a side. Next, molten solder (solder 81) is applied onto the emitter electrode 31 of the semiconductor element 30, and the terminal 55 is disposed on the molten solder such that the first end face 55a is on the semiconductor element 30 side. Further, molten solder (solder 82) is applied onto the second end face 55b of the terminal 55. Molten solder (solder 83, solder 84) is also applied onto each of the coupling 60 and the connection part 71a. The molten solder can be applied using, for example, a transfer method. The applied molten solder is solidified to obtain a laminate of the heatsink 40, the semiconductor element 30, and the terminal 55.

All of the solder 80 to the solder 84 may be solidified at once or may be solidified in the order of lamination. By performing the solidification at once, the manufacturing process can be simplified (e.g., the manufacturing time can be shortened). The bonding wire 87 may be connected in the state of the laminate or may be connected in a state where the solder 80 is solidified before the solder 81 is applied. Bonding in the state of the laminate in which the application of all of the solder 80 to the solder 84 has been completed is preferable because it is possible to prevent defects due to contact of an application device or the like.

The semiconductor device 10 having the double-sided heat dissipation structure is sandwiched from both sides in the Z-direction by, for example, a cooler (not illustrated). Thus, high parallelism of the surfaces and high dimensional accuracy between the surfaces in the Z-direction are required. Therefore, the solder 82 is disposed in an amount capable of absorbing the height variation of the semiconductor device 10. That is, a larger amount of solder 82 is disposed. For example, the solder 82 is thicker than the solder 80 and the solder 81.

Next, the heatsink 50 is disposed on a mount (not illustrated) such that the mounting surface 50*a* faces upward. The laminate is disposed on the heatsink 50 such that the solder 82 faces the mounting surface 50*a* of the heatsink 50, and reflow is performed. In the reflow, a load (outlined arrow) is applied in the Z-direction from the heatsink 40 side to set the height of the semiconductor device 10 to a predetermined height. Specifically, a load is applied to bring a spacer (not illustrated) into contact with both the mounting surface 40*a* of the heatsink 40 and the placement surface of the mount. In this manner, the height of the semiconductor device 10 is set to the predetermined height.

The terminal 55 and the heatsink 50 are connected (bonded) via the solder 82 by reflow. That is, the emitter electrode 31 and the heatsink 50 are connected electrically. The solder 82 absorbs the height variation due to dimensional tolerance and assembly tolerance of elements constituting the semiconductor device 10. For example, when the entire amount of the solder 82 is required in order to set the height of the semiconductor device 10 to the predetermined height, the entire amount of the solder 82 remains in a connection region inside the groove 51. On the other hand, for the setting to the predetermined height, when a part of the solder 82 overflows, the overflowing solder 82 is held in the groove 51. The same applies to the solder 83 and the solder 84, and hence the description thereof will be omitted.

Next, the sealing resin body 20 is molded by a transfer molding method. Although not illustrated, in the present embodiment, the sealing resin body 20 is molded such that the heatsinks 40, 50 are completely covered, and cutting is performed after molding. The sealing resin body 20 is cut together with a part of each of the heatsinks 40, 50. This makes the back surfaces 40*b*, 50*b* exposed. The back surface 40*b* is substantially flush with the back surface 20*b*, and the back surface 50*b* is substantially flush with the front surface 20*a*. The sealing resin body 20 may be molded in a state where the back surfaces 40*b*, 50*b* are pressed against and brought into close contact with a cavity wall surface of a molding die. In this case, at the point when the sealing resin body 20 is molded, the back surfaces 40*b*, 50*b* are exposed from the sealing resin body 20. This eliminates the need for cutting after molding.

Next, tie bars (not illustrated) and the like are removed, whereby the semiconductor device 10 can be obtained.

The example in which the heatsink 50 is disposed and the reflow is performed after the formation of the laminate has been shown, but the present disclosure is not limited thereto. After molten solder (solder 82) is applied onto the second end face 55*b* of the terminal 55, the heatsink 50 may be disposed on the molten solder. Alternatively, all of the solder 80 to the solder 84 may be solidified at once to form a laminate including the heatsink 50 at once. That is, the semiconductor device 10 can be obtained without performing reflow.

Summary of First Embodiment

Reduction in the number of components, reduction in cost, and the like may be performed by using the heatsink 40 as a common component for semiconductor elements 30 of various types (a plurality of product numbers). The semiconductor element 30 has the emitter electrode 31 on the front surface and the collector electrode 32 on the back surface, and the areas of the emitter electrode 31 and the collector electrode 32 are different. In such a configuration, warpage may occur in different directions depending on the product type or depending on the film thickness, the film forming method, the chip size, the electrode area, or the like. For example, in one type, warpage toward the heatsink 40, that is, downward, occurs and in another type, warpage toward the side opposite to the heatsink 40, that is, upward, occurs. Even when the element size (chip size) is the same, the direction of warpage may be different because, for example, the film formation method (film configuration) is different. Furthermore, the direction of warpage may be different in the same product type due to variations in manufacturing conditions.

In contrast, in the present embodiment, a plurality of wire pieces 90 are provided in the solder bonding part between the collector electrode 32 of the semiconductor element 30 and the heatsink 40. The wire piece 90 is fixed to the mounting surface 40*a* of the heatsink 40, which is the first facing surface, and protrudes on the back surface side of the semiconductor element 30, which is the second facing surface. In the central region 80*a* of the solder 80, three or more wire pieces 90*a* are arranged to surround the element center 30*c*. In the outer peripheral region 80*b* of the solder 80, four or more wire pieces 90*b* are arranged to correspond to at least the four respective corners of the semiconductor element 30, respectively.

Figure 10:
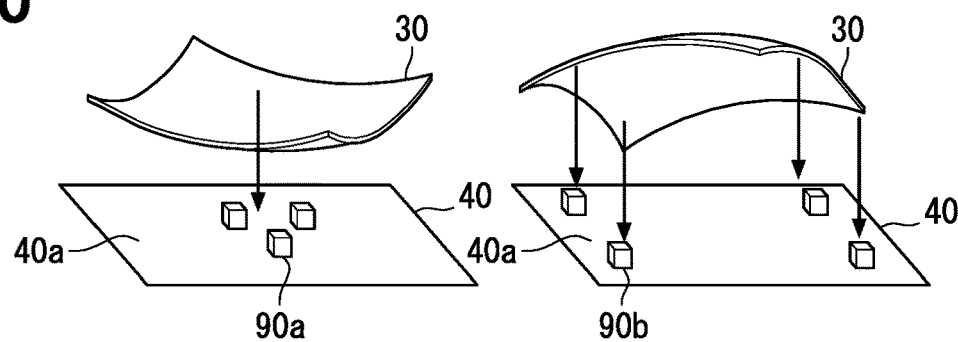
FIG. 10 is a perspective view illustrating the warpage of the semiconductor element and the effect of the wire pieces.

Therefore, as illustrated in FIG. 10, when the semiconductor element 30 has warped downward, the minimum film thickness of the solder 80 can be ensured by the wire pieces 90*a* that are disposed to surround the element center 30*c*. For example, the semiconductor element 30 can be supported by three or more wire pieces 90*a* arranged to surround the element center 30*c*. As a result, the inclination of the semiconductor element 30 can be prevented to ensure the minimum film thickness throughout the surface.

When the semiconductor element 30 has warped upward, the minimum film thickness of the solder 80 can be ensured by the wire pieces 90*b* arranged corresponding to at least the four corners of the semiconductor element 30. For example, the semiconductor element 30 can be supported by the wire pieces 90*b* arranged at least at the four corners. As a result, the inclination of the semiconductor element 30 can be prevented to ensure the minimum film thickness throughout the surface. As described above, even when the wire piece 90 comes into contact with the collector electrode 32, the minimum film thickness of the solder 80 can be ensured by the height of the wire piece 90.

Further, the wire piece 90 is fixed to the heatsink 40. That is, the solder is not put into a melting furnace of the solder and applied together with the molten solder. The shape of the wire piece 90 can be maintained even when molten solder is applied.

As described above, the film thickness of the solder 80 can be ensured regardless of whether the semiconductor element 30 has warped downward or upward. Even when various semiconductor elements 30 are used, the film thickness of the solder 80 can be ensured. This makes it possible to provide the semiconductor device 10 with high reliability. Since the solder thickness can be ensured, the detection accuracy of voids by an ultrasonic flaw detector (scanning acoustic tomograph (SAT)) can also be improved. Moreover, the cost can be reduced as compared to the method using Ni balls. In FIG. 10, the solder 80 is omitted for convenience.

Although the example in which the wire piece 90 is fixed to the mounting surface 40*a* of the heatsink 40 has been described, the configuration is not limited thereto. The wire piece 90 may be fixed to the collector electrode 32 of the semiconductor element 30. That is, the back surface of the semiconductor element 30 may be the first facing surface. However, the structure in which the wire piece 90 is fixed to the heatsink 40 (back-side wiring member) is preferable because the influence at the time of bonding the wire piece 90 is small.

The number and arrangement of the wire pieces 90 are not limited to the above example. Depending on the warpage of the semiconductor element 30, the wire pieces 90 may be arranged only in the central region 80a, or the wire pieces 90 may be arranged only in the outer peripheral region 80b. In the central region 80a, four or more wire pieces 90a may be arranged to surround the element center 30c. In the outer peripheral region 80b, the wire pieces 90b may be arranged at the four corners as well as at portions except for the four corners. That is, five or more wire pieces 90b may be arranged to surround the element center 30c. The positions of the wire pieces 90 may be adjusted when the wire pieces 90 are provided in accordance with the magnitude (size) of the semiconductor element 30.

The configuration of the semiconductor device 10 is not limited to the above example. For example, the terminal 55 may not be provided. In this case, it is sufficient that the emitter electrode 31 and the mounting surface 50a of the heatsink 50 be connected. A protrusion may be provided on the mounting surface 50a of the heatsink 50, and a solder bonding part may be formed between the tip of the protrusion and the emitter electrode 31.

The present embodiment can also be applied to a configuration not including the front-side wiring member, that is, the terminal 55 and the heatsink 50. For example, a bonding wire may be connected to the emitter electrode 31 to connect the upper arm 6H and the lower arm 6L and to connect the main terminal. The wire piece 90 may be provided on only one of the solder 80 on the upper arm 6H side and the solder 80 on the lower arm 6L side.

Second Embodiment

The present embodiment is a modification with the preceding embodiment as a basic form, and the description of the preceding embodiment can be incorporated.

Figure 11:
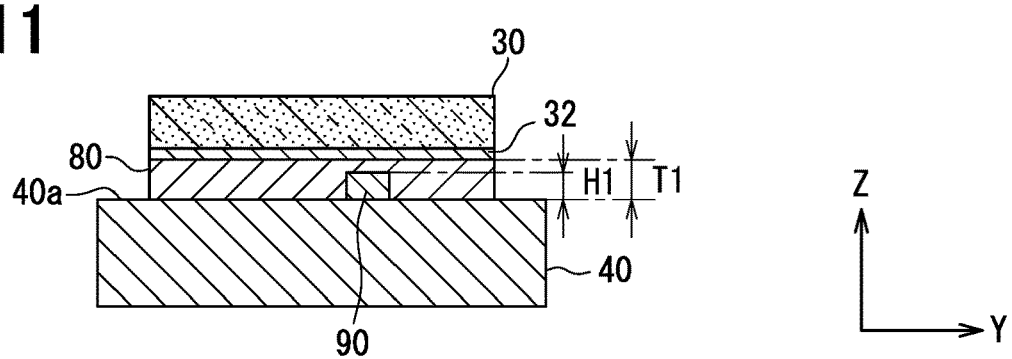
FIG. 11 is a plan view illustrating a height of a wire piece in the semiconductor device according to a second embodiment.

As described in the preceding embodiment, in the semiconductor device 10, the wire piece 90 may be in contact with the second facing surface or may not be in contact with the second facing surface. Preferably, as illustrated in FIG. 11, the wire piece 90 may not be into contact with the collector electrode 32 that is the second facing surface. FIG. 11 is a sectional view illustrating a periphery of a connection part between the semiconductor element and the heatsink in the semiconductor device 10 according to the present embodiment. FIG. 11 corresponds to FIG. 9. In FIG. 11, for convenience, the electrode on the front surface side of the semiconductor element 30 is omitted. The configuration of the semiconductor device 10 is similar to that in the first embodiment, for example. The configuration illustrated in FIG. 11 is the same on the upper arm 6H side and the lower arm 6L side.

The wire piece 90 is fixed to the mounting surface 40a of the heatsink 40 and is disposed in the solder 80. In the bonding part formed of the solder 80, the mounting surface 40a forms a first facing surface, and the front surface of the collector electrode 32 forms a second facing surface. A protrusion height H1 of the wire piece 90 with reference to the mounting surface 40a is less than a thickness T1 of the solder 80. The wire piece 90 is not in contact with the collector electrode 32 and has a gap from the collector electrode 32. The protrusion height H1 is a height that can ensure the minimum film thickness as described above. The protrusion height H1 is, for example, about 50 to 100 μm. The target value of the solder 80 is, for example, about 150 μm.

Summary of Second Embodiment

According to the present embodiment, the protrusion height H1 of the wire piece 90 is less than the thickness T1 of the solder 80. Therefore, at the time of forming the semiconductor device 10, the wire piece 90 does not come into contact with the second facing surface. It is possible to prevent the collapse of the wire piece 90 due to contact and thus ensure a predetermined solder thickness.

In the present embodiment, the main electrode is the second facing surface. That is, the wire piece 90 is fixed to the surface facing the main electrode. Therefore, by satisfying the condition that the protrusion height H1 is less than the thickness T1 of the solder 80, it is also possible to prevent the wire piece 90 from coming into contact with the collector electrode 32 and damaging the collector electrode 32.

Although the example in which the above relationship is applied to the configuration of the first embodiment has been shown, the present disclosure is not limited thereto. For example, the present embodiment can also be applied to a configuration in which the number of wire pieces 90 arranged in the solder 80 is different from that in the first embodiment (e.g., a total of three). The number of wire pieces 90 disposed in the solder 80 may be plural, preferably three or more. The configuration described in the first embodiment is more preferable.

The present embodiment is not limited to the wire piece 90 in the solder 80. The present embodiment can be applied to any solder in which the wire piece 90 is disposed. It is particularly suitable for a solder bonding part of a main electrode. For example, when the present embodiment is applied to a configuration in which the wire piece 90 is provided in the solder 81 and the wire piece 90 is fixed to the terminal 55, a predetermined solder thickness can be ensured, and damage to the emitter electrode 31 can be prevented. Only one of the upper arm 6H side and the lower arm 6L side may satisfy the above relationship.

Third Embodiment

The present embodiment is a modification with the preceding embodiment as a basic form, and the description of the preceding embodiment can be incorporated.

Figure 12:
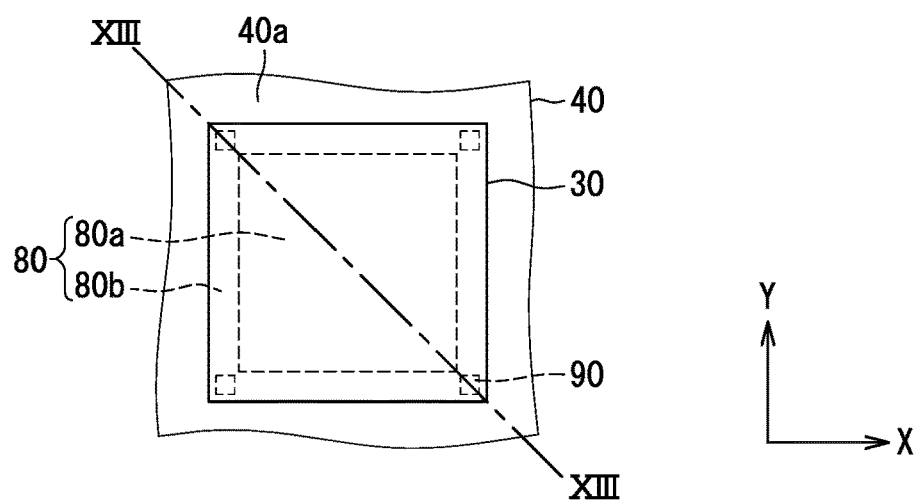
FIG. 12 is a plan view illustrating a positional relationship between a semiconductor element and wire pieces in a semiconductor device according to a third embodiment.

In the present embodiment, the wire pieces 90 are disposed only in the outer peripheral region 80b as illustrated in FIG. 12. FIG. 12 is a plan view illustrating a positional relationship between the semiconductor element 30 and the wire pieces 90 in the semiconductor device 10 of the present embodiment. FIG. 12 corresponds to FIG. 7. The wire pieces 90 are arranged at positions corresponding to at least the four respective corners of the semiconductor element 30 in the outer peripheral region 80b. In FIG. 12, the wire pieces 90 are arranged only at the four corners. The wire piece 90 is not disposed in the central region 80a. The configuration illustrated in FIG. 12 is the same on the upper arm 6H side and the lower arm 6L side.

Although not illustrated, the emitter electrode 31 of the semiconductor element 30 includes a base electrode part formed on the surface of the semiconductor substrate using an Al-based material such as AlSi and a connection electrode part formed on the base electrode part. The base electrode part is formed by, for example, a sputtering method. The connection electrode part is formed by a plating method. The connection electrode part includes, for example, a Ni layer formed on the base electrode part and an Au layer formed on the Ni layer. The collector electrode 32 is formed by the sputtering method. The collector electrode 32 includes an Al layer formed on the back surface of the semiconductor substrate using an Al-based material such as AlSi, and a Ni layer formed on the Al layer. The emitter electrode 31 using the plating method is thicker than the collector electrode 32.

Summary of Third Embodiment

Figure 13:
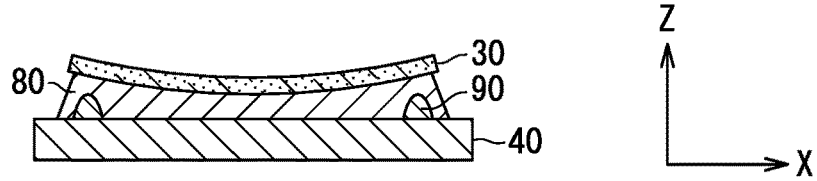
FIG. 13 is a sectional view taken along a line XIII-XIII of FIG. 12.

FIG. 13 is a sectional view taken along a line XIII-XIII of FIG. 12 and illustrates a connection structure between the semiconductor element 30 and the heatsink 40. In the electrode configuration described above, the semiconductor element 30 can warp downward as illustrated in FIG. 13. In the present embodiment, the supply amount of the solder 80 is set so as to ensure the minimum film thickness of the solder 80. The solder 80 is supplied so as to ensure a predetermined thickness equal to or more than the minimum film thickness in a state where the bonding part between the semiconductor element 30 (collector electrode 32) and the heatsink 40 wets and spreads. As illustrated in FIG. 13, the semiconductor element 30 is supported by the solder 80 and is not in contact with the wire piece 90. During soldering, the semiconductor element 30 floats on the molten solder. The solder 80 is supplied such that the solder thickness between the tip of the convex of the semiconductor element 30, that is, the element center, and the heatsink 40 can ensure the minimum film thickness. FIG. 13 illustrates an ideal state in which there is no inclination in the placement of the semiconductor element 30 with respect to the heatsink 40.

Figure 14:
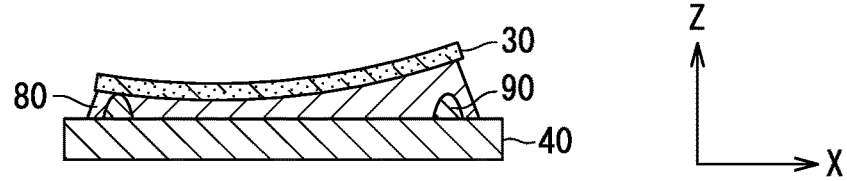
FIG. 14 is a sectional view when the semiconductor element is disposed in an inclined manner.

FIG. 14 is a sectional view when semiconductor element 30 is disposed in an inclined manner. As illustrated in FIG. 14, when the semiconductor element 30 having warped downward is disposed in an inclined manner, the semiconductor element 30 comes into contact with some of the plurality of wire pieces 90. By the wire pieces 90 supporting the semiconductor element 30, the minimum film thickness of the solder 80 is ensured. The wire piece 90 has a height that can ensure the minimum film thickness of the solder 80 when the semiconductor element 30 having warped is disposed in an inclined manner. Since the wire pieces 90 are arranged at least at the four corners of the outer peripheral region 80b, the semiconductor element 30 can be supported by at least one of the wire pieces 90 even when the semiconductor element 30 is inclined in any direction. As described above, according to the semiconductor device 10 of the present embodiment, even when the semiconductor element 30 has warped downward, the film thickness of the solder 80 can be ensured. It is thus possible to provide the semiconductor device 10 with high reliability (connection reliability).

The electrode configuration in which the semiconductor element 30 has warped downward is not limited to the above example.

In the outer peripheral region 80b, the wire pieces 90 may be arranged at the four corners as well as at portions except for the four corners. That is, five or more wire pieces 90b may be arranged to surround the element center 30c.

Fourth Embodiment

The present embodiment is a modification with the preceding embodiment as a basic form, and the description of the preceding embodiment can be incorporated.

Figure 15:
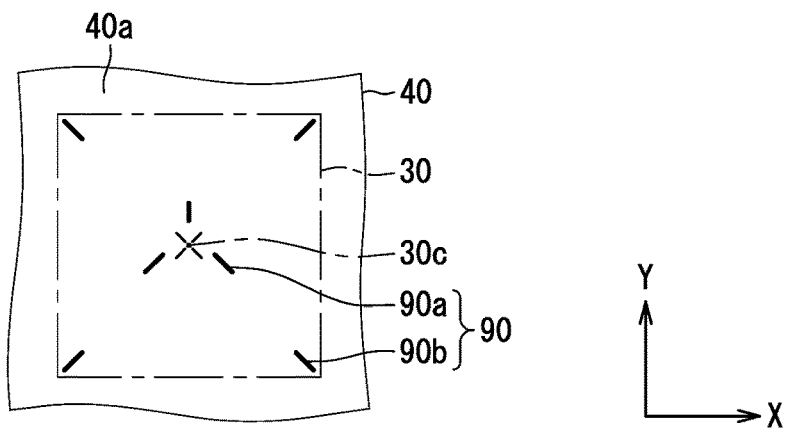
FIG. 15 is a plan view illustrating an arrangement of wire pieces in a semiconductor device according to a fourth embodiment.

The extending direction of the wire piece 90 is not particularly limited on the first facing surface. The wire piece 90 can be extended in any direction. Preferably, the wire piece 90 may extend in a predetermined direction illustrated in FIG. 15. FIG. 15 is a plan view illustrating a periphery of a connection part between the semiconductor element and the heatsink in the semiconductor device 10 according to the present embodiment. FIG. 15 corresponds to FIG. 7. In FIG. 15, in order to clarify the wire piece 90, the semiconductor element 30 is indicated by a one-dot chain line, and the wire piece 90 is indicated by a solid line. The configuration of the semiconductor device 10 is similar to that in the first embodiment, for example. The configuration illustrated in FIG. 15 is the same on the upper arm 6H side and the lower arm 6L side.

The wire piece 90 is fixed to the mounting surface 40a of the heatsink 40. The number and arrangement of the wire pieces 90 are similar to those in the first embodiment (cf. FIG. 7). In the present embodiment, the wire piece 90 extends toward the element center 30c in a plan view. That is, the extending direction (longitudinal direction) of the wire piece 90 is substantially parallel to an imaginary line connecting the wire piece 90 and the element center 30c. The wire piece 90 extends along the imaginary line. Of the wire pieces 90, all three wire pieces 90a arranged in the central region 80a of the solder 80 extend toward the element center 30c. All four wire pieces 90b arranged in the outer peripheral region 80b of the solder 80 extend toward the element center 30c.

Summary of Fourth Embodiment

According to the present embodiment, since the wire piece 90 extends toward the element center 30c, when the applied molten solder wets and spreads, the wire piece 90 hardly obstructs the flow thereof. It is thereby possible to prevent generation of voids in the solder 80 and generation of an unfilled portion between the facing surfaces. By setting at least one of the plurality of wire pieces 90 in the extending direction described above, a considerable effect can be obtained. In the present embodiment, all the wire pieces 90 arranged in the solder 80 extend toward the element center 30c. As a result, it is possible to enhance the effect described above and thus enhance connection reliability.

Figure 16:
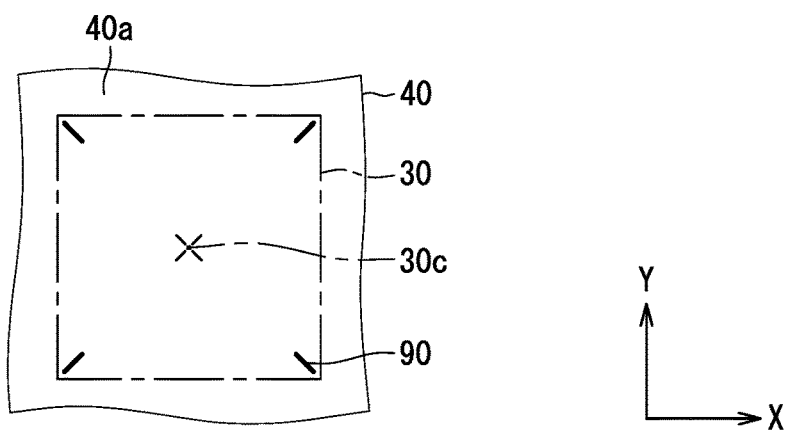
FIG. 16 is a plan view illustrating a modification.

Although the example in which the above relationship is applied to the configuration of the first embodiment has been shown, the present disclosure is not limited thereto. For example, the present embodiment can also be applied to a configuration in which the number and arrangement of the wire pieces 90 arranged in the solder 80 are different from those in the first embodiment. For example, as in a modification illustrated in FIG. 16, the present embodiment may be applied to the configuration of the third embodiment (cf. FIG. 12). The wire pieces 90 arranged in the outer peripheral region 80b of the solder 80 extend toward the element center 30c. Hence it is possible to enhance connection reliability while obtaining the effects described in the third embodiment. By setting at least one of the plurality of wire pieces 90 in the extending direction described above, a considerable effect can be obtained. In FIG. 16, all the wire pieces 90 arranged in the outer peripheral region 80b extend toward the element center 30c. Therefore, connection reliability can be further improved.

The control of the extending direction is not limited to the wire piece 90 in the solder 80. The present embodiment can be applied to any solder in which the wire piece 90 is disposed. For example, when the wire piece 90 is disposed in the solder 81, the present embodiment may be applied to this wire piece 90. When the wire piece 90 is disposed in the solder 82, the present embodiment may be applied to this wire piece 90. In addition, the extending direction described above may be achieved by only one of the upper arm 6H side and the lower arm 6L side.

In consideration of solder deformation, the extension length may be set as follows. When the extension length of the wire piece 90 is equal to or less than a predetermined length in a plan view, solder deformation is maximized at the end (outer peripheral end) of the solder 80. On the other hand, when the extension length exceeds the predetermined length, the solder deformation is maximized at the end of the wire piece 90. When the extension length increases, the solder deformation at the end of the wire piece increases, and when the extension length exceeds the predetermined length, the magnitude relationship of the solder deformation between the end of the wire piece and the end of the solder is reversed. Therefore, the extension length is preferably set within a range in which the solder deformation at the end of the wire piece 90 does not exceed the solder deformation at the end of the solder 80. For example, the length of the wire piece 90 may be set to 350 μm or less with respect to 80 μm of the diameter of the aluminum-based bonding wire forming the wire piece 90. Specifically, the length may be set within a range of 200 to 350 μm.

Fifth Embodiment

The present embodiment is a modification with the preceding embodiment as a basic form, and the description of the preceding embodiment can be incorporated.

Figure 17:
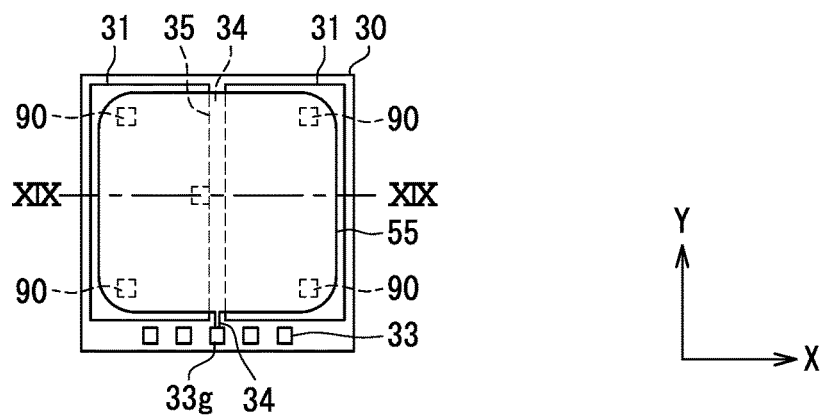
FIG. 17 is a plan view illustrating a positional relationship between a semiconductor element and wire pieces in a semiconductor device according to a fifth embodiment.
Figure 18:
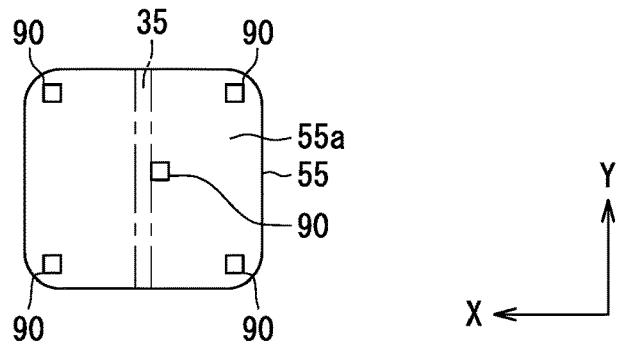
FIG. 18 is a plan view illustrating an arrangement of wire pieces.
Figure 19:
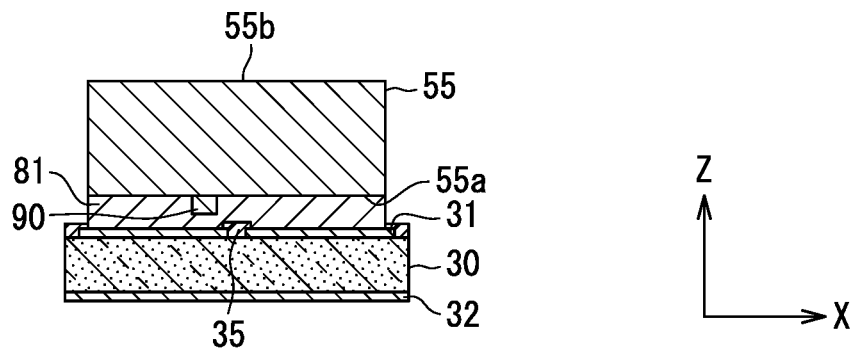
FIG. 19 is a sectional view taken along a line XIX-XIX in FIG. 17.

As illustrated in FIGS. 17 to 19, the wire piece 90 may be disposed in the solder 81 that bonds the front electrode and the front-side wiring member. At this time, the wire pieces 90 may be arranged at the positions illustrated in FIGS. 17 to 19. FIG. 17 illustrates a positional relationship between the wire pieces 90 arranged in the solder 81 and the semiconductor element 30 in the semiconductor device 10 according to the present embodiment. FIG. 18 illustrates the arrangement of the wire pieces 90 in the terminal 55. FIG. 19 is a sectional view taken along a line XIX-XIX of FIG. 17. In FIG. 19, for convenience, the gate wiring 34 is omitted. The configuration of the semiconductor device 10 of the present embodiment is, for example, similar to that in the first embodiment. The configuration of the wire pieces 90 arranged in the solder 81 are the same on the upper arm 6H side and the lower arm 6L side.

The plurality of wire pieces 90 are provided in a solder bonding part between the emitter electrode 31 of the semiconductor element 30 and the first end face 55a of the terminal 55. All of the plurality of wire pieces 90 are fixed (bonded) to the first end face 55a of the terminal 55 and are not fixed onto the emitter electrode 31 of the semiconductor element 30, that is, to the surface. The first end face 55a of the terminal 55 corresponds to a first facing surface, and the front surface of the semiconductor element 30 corresponds to a second facing surface. A plurality of wire pieces 90 are fixed to the first end face 55a. All the wire pieces 90 fixed to the first end face 55a are arranged in the solder 81.

The semiconductor element 30 includes the gate pad 33g as described above. The semiconductor element 30 includes gate wiring 34 formed on the front surface side and continuous with the gate pad 33g, and a gate wiring protection part 35 that is a portion of the protective film formed on the front surface and protects the gate wiring 34. The emitter electrode 31 is divided into two in the X-direction, and the gate wiring 34 is formed using aluminum or the like as a material between the adjacent emitter electrodes 31.

A protective film is formed using polyimide or the like as a material on the front surface of the semiconductor element 30, and the emitter electrode 31 and the pad 33 are exposed from the protective film. The gate wiring protection part 35 is a portion being a part of the protective film and covering the gate wiring 34. In FIG. 17, a portion of the gate wiring protection part 35 overlapping with the terminal 55 in a plan view is indicated as a region of a broken line. In FIG. 18, for illustrating the positional relationship, the gate wiring protection part 35 is illustrated as a region of a one-dot chain line on the first end face 55a of the terminal 55.

The wire pieces 90 are arranged at positions not overlapping with the gate wiring protection part 35 in a plan view. As illustrated in FIGS. 17 and 18, one wire piece 90 is fixed near the center of the first end face 55a and at a position not overlapping with the gate wiring protection part 35. The wire pieces 90 are fixed to the four respective corners of the first end face 55a having a substantially rectangular planar shape. In this manner, the five wire pieces 90 are fixed to the first end face 55a.

Summary of Fifth Embodiment

In the present embodiment, the plurality of wire pieces 90 are arranged in the solder 81. This makes it possible to ensure the minimum film thickness of the solder 81.

All of the wire pieces 90 in the solder 81 are provided at positions not overlapping with the gate wiring protection part 35 in a plan view. Thus, at the time of forming the semiconductor device 10, it is possible to prevent the wire piece 90 from coming into contact with the gate wiring protection part 35 and damaging the protective film. Therefore, it is possible to prevent the occurrence of a short circuit between the gate electrode and the emitter electrode 31, that is, a gate leak failure, due to the solder 81 entering the gate wiring 34 side from the damaged portion of the protective film.

The emitter electrode 31 is smaller in area than the collector electrode 32. In other words, the bonding part of the solder 81 is smaller than the bonding part of the solder 80 in a plan view. Thus, even when the semiconductor element 30 warps upward, the semiconductor element 30 can be supported by one wire piece 90 provided near the center of the first end face 55a. This makes it possible to ensure the minimum film thickness of the solder 81. Even when the semiconductor element 30 warps downward, the semiconductor element 30 can be supported by the wire pieces 90 arranged at the four corners. This makes it possible to ensure the minimum film thickness of the solder 81. Accordingly, it is possible to provide the semiconductor device 10 with high reliability.

Although the example in which the wire piece 90 is fixed to the first end face 55a of the terminal 55 has been described, the present disclosure is not limited thereto. The wire piece 90 may be fixed to the emitter electrode 31 of the semiconductor element 30. That is, the front surface of the semiconductor element 30 may be the first facing surface. However, the structure in which the wire piece 90 is fixed to the terminal 55 (front-side wiring member) is preferable because the influence at the time of bonding the wire piece 90 is small.

The number and arrangement of the wire pieces 90 in the solder 81 are not limited to the above example. The wire piece 90 can be disposed in a range satisfying a condition that the wire piece 90 does not overlap with the gate wiring protection part 35 in a plan view. For example, a plurality of wire pieces 90 may be arranged near the center of the first end face 55a. Further, in the vicinity of the outer peripheral end of the first end face 55a, the wire pieces 90 may be arranged at four corners as well as portions except for the four corners. The above arrangement may be achieved by only one of the upper arm 6H side and the lower arm 6L side.

Although the example in which the above relationship is applied to the configuration of the first embodiment has been shown, the present disclosure is not limited thereto. At least one of the configuration of the second embodiment, the configuration of the third embodiment, and the configuration of the fourth embodiment may be combined with the wire pieces 90 arranged in the solder 81. For example, the present embodiment can also be applied to a configuration in which the number of wire pieces 90 arranged in the solder 80 is different from that in the first embodiment. For example, the number of wire pieces 90 arranged in each of the solder 80 and the solder 81 may be the same.

Figure 20:
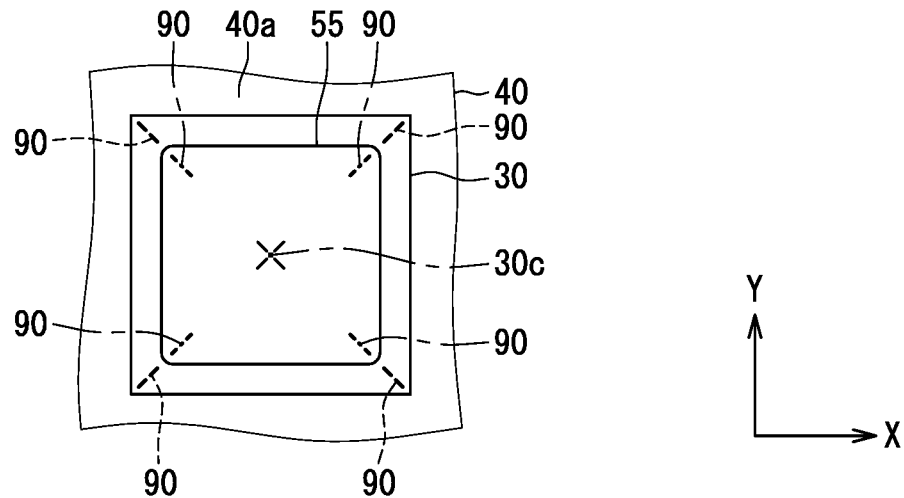
FIG. 20 is a plan view illustrating a modification.

In a modification illustrated in FIG. 20, the wire pieces 90 are arranged at the four corners of the outer peripheral region 80b of the solder 80, and the wire pieces 90 are arranged at the four corners of the solder 81. That is, four wire pieces 90 are arranged in each of the solder 80 and the solder 81. Even when the semiconductor element 30 warps downward, the semiconductor element 30 can be supported by the wire pieces 90 disposed in the solder 81. This makes it possible to ensure the minimum film thickness of the solder 81. The wire pieces 90 in the solder 81 are arranged at positions not overlapping with the gate wiring protection part 35. The wire pieces 90 arranged in the solder 80 and the solder 81 extend toward the element center 30c similarly to the configuration illustrated in FIG. 16. FIG. 20 is a plan view of the terminal 55 as viewed from the second end face side. In FIG. 20, the wire piece 90 disposed in the solder 80 is indicated by a broken line, and the wire piece 90 disposed in the solder 81 is indicated by a one-dot chain line.

The wire piece 90 may be disposed in the solder 80 as described above without disposing the wire piece 90 in the solder 81. The configuration of the present embodiment can also be applied to a configuration not including the back-side wiring member, that is, the heatsink 40.

Although the example in which the semiconductor device 10 includes the terminal 55 has been described, the present disclosure is not limited thereto. The present embodiment can also be applied to a configuration not including the terminal 55. For example, in the solder bonding part between the emitter electrode 31 and the mounting surface 50a of the heatsink 50, the wire piece 90 may be fixed to the mounting surface 50a of the heatsink 50.

Sixth Embodiment

The present embodiment is a modification with the preceding embodiment as a basic form, and the description of the preceding embodiment can be incorporated.

Figure 21:
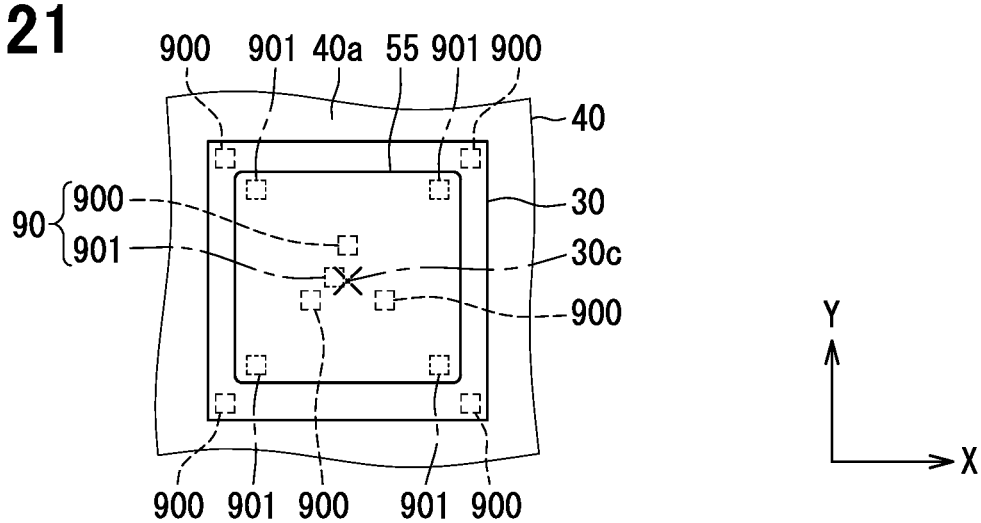
FIG. 21 is a plan view illustrating a positional relationship between a semiconductor element and wire pieces in a semiconductor device according to a sixth embodiment.

When the wire pieces 90 are arranged on each of the solder 80 and the solder 81, the arrangement of the wire pieces 90 is not particularly limited. The wire pieces 90 may be arranged as illustrated in FIG. 21. FIG. 21 is a plan view of the terminal as viewed from the second end face side in the semiconductor device 10 according to the present embodiment. FIG. 21 corresponds to FIG. 7. The configuration of the semiconductor device 10 is similar to that in the first embodiment, for example. The configuration illustrated in FIG. 21 is the same on the upper arm 6H side and the lower arm 6L side.

The semiconductor device 10 includes a plurality of wire pieces 90 arranged in the solder 80 and a plurality of wire pieces 90 arranged in the solder 81. Hereinafter, the wire piece 90 disposed in the solder 80 may be referred to as a wire piece 900, and the wire piece 90 disposed in the solder 81 may be referred to as a wire piece 901. In FIG. 21, the wire piece 900 is indicated by a broken line, and the wire piece 901 is indicated by a one-dot chain line.

The wire pieces 900 are arranged similarly to the wire pieces 90 (cf. FIG. 7) described in the first embodiment. The wire piece 900 is fixed to, for example, the mounting surface 40a of the heatsink 40. In the central region 80a of the solder 80, three wire pieces 900 are arranged to surround the element center 30c. In the outer peripheral region 80b, four wire pieces 900 are arranged corresponding to the four respective corners of the semiconductor element 30.

The wire pieces 901 are arranged similarly to the wire pieces 90 (cf. FIG. 17) described in the fifth embodiment. The wire piece 901 is fixed to, for example, the first end face 55a of the terminal 55. One wire piece 901 is disposed near the center of the first end face 55a. The wire pieces 901 are arranged at the four corners of the first end face 55a. As illustrated in FIG. 21, the wire pieces 900 and the wire pieces 901 are arranged at positions not overlapping with each other in a plan view.

Summary of Sixth Embodiment

Figure 22:
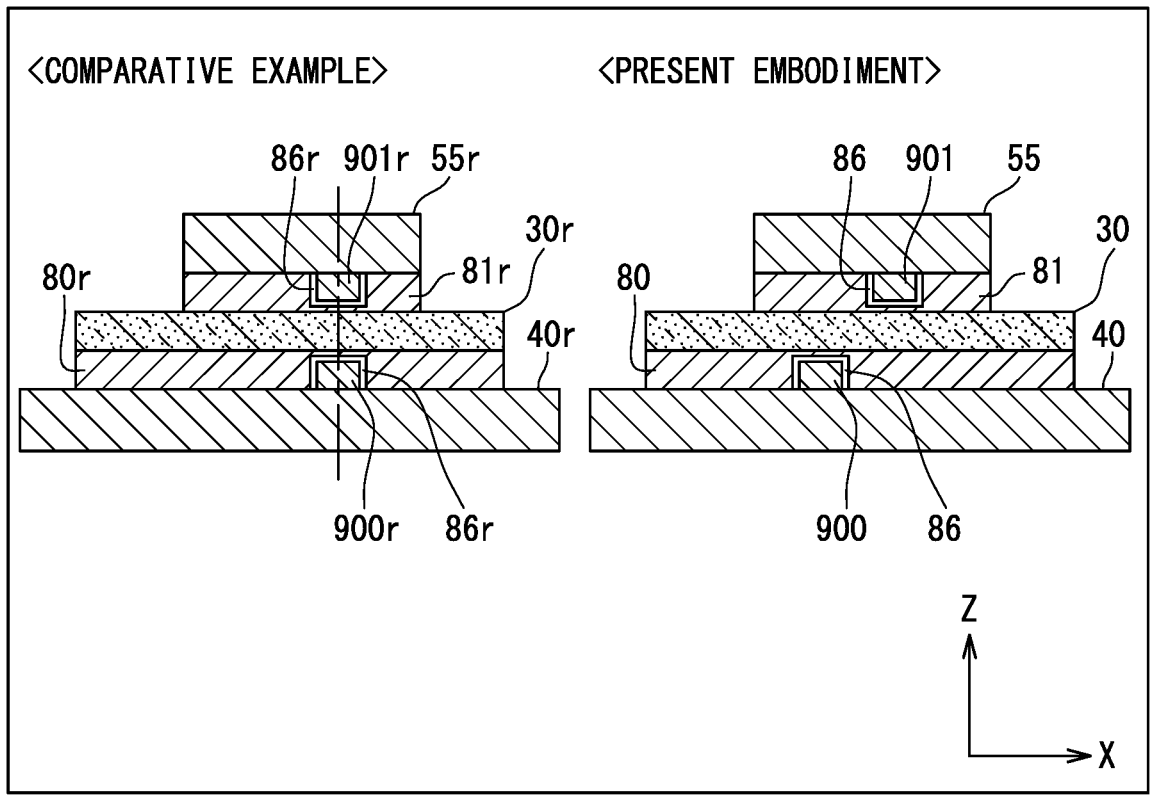
FIG. 22 is a schematic sectional view illustrating an influence of a positional relationship between the wire pieces in upper and lower portions.

FIG. 22 is a schematic diagram illustrating the difference between a comparative example and the present example (present embodiment). In the comparative example, the same or related elements as or to the elements of the present embodiment (the present example) are indicated by adding r to the end of the reference numerals in the present embodiment. In FIG. 22, for convenience, the main electrode of the semiconductor element is omitted.

Wire pieces 900r, 901r are formed using an aluminum-based material as described above and have lower wettability by solder 80r and solder 81r than those of the main electrode (not illustrated) of a semiconductor element 30r, a heatsink 40r, and a terminal 55r. Therefore, gaps 86r are formed between the wire pieces 900r, 901r and the solder 80r and the solder 81r. The gap 86r prevents heat conduction. As in the comparative example, when the wire pieces 900r, 901r overlap with each other in a plan view, the gaps 86r also overlap. Since the gaps 86r exist on both sides in the Z-direction with respect to the semiconductor element 30r, it is difficult to release heat in the Z-direction from the portions of the semiconductor element 30r overlapping with the gaps 86r (wire pieces 900r, 901r). This causes an increase in thermal resistance.

In the present embodiment (present example) as well, similarly to the comparative example, the gaps 86 are formed between the wire piece 900 and the solder 80 and between the wire piece 901 and the solder 81. However, since the wire pieces 900, 901 are arranged at positions not overlapping with each other in a plan view, the gaps 86 in the solder 80 and the solder 81 do not overlap with each other in a plan view, or even when the gaps 86 overlap, the overlapping portion is very small. Hence the heat of the semiconductor element 30 can be released to at least one side in the Z-direction. As a result, the thermal resistance can be reduced and the heat dissipation can be enhanced as compared to the comparative example. In another embodiment, the gap 86 is omitted in the drawing.

In the present embodiment, the wire piece 900 has a similar configuration to that in the first embodiment. Therefore, in addition to the effects described in the present embodiment, the effects described in the first embodiment can also be obtained. The wire pieces 901 are configured and arranged in the same manner as in the fifth embodiment. Therefore, in addition to the effects described in the present embodiment, the effects described in the fifth embodiment can also be obtained. However, the number and arrangement of the wire pieces 900, 901 can be selected within a range satisfying a condition that the wire pieces 900, 901 do not overlap with each other in a plan view. That is, the number and arrangement are not limited to the above examples.

For example, only the wire piece 900 may have a similar configuration to that of the first embodiment, and the wire piece 901 may have a configuration different from that of the fifth embodiment. Only the wire piece 901 may have a similar configuration to that of the fourth embodiment, and the wire piece 900 may have a configuration different from that of the first embodiment. The number of wire pieces 900, 901 may be the same. In the configuration illustrated in FIG. 20, the number of wire pieces 90 of the solder 80 and the number of wire pieces 90 of the solder 81 are the same. The wire pieces 90 on the solder 80 side corresponding to the wire pieces 900 and the wire pieces 90 on the solder 81 side corresponding to the wire pieces 901 are arranged at positions not overlapping with each other in a plan view.

Although the example in which the wire piece 900 is fixed to the heatsink 40 has been described, the wire piece 900 may be fixed to the back surface (collector electrode 32) of the semiconductor element 30. Although the example in which the wire piece 901 is fixed to the terminal 55 has been described, the wire piece 901 may be fixed to the front surface (emitter electrode 31) of the semiconductor element 30. The wire piece 900 may be fixed to the heatsink 40, and the wire piece 901 may be fixed to the semiconductor element 30. The wire piece 900 may be fixed to the semiconductor element 30, and the wire piece 901 may be fixed to the terminal 55. The terminal 55 may not be provided. In this case, the wire piece 901 is provided in the solder bonding part between the heatsink 50 and the semiconductor element 30 (emitter electrode 31).

The configuration of the present embodiment may be combined with at least one of the configuration of the second embodiment, the configuration of the third embodiment, and the configuration of the fourth embodiment. The configuration of the second embodiment may be combined with at least one of the wire pieces 900, 901. The configuration of the third embodiment may be combined with at least one of the wire pieces 900, 901. The configuration of the fourth embodiment may be combined with at least one of the wire pieces 900, 901. The configuration of the present embodiment may be achieved by only one of the upper arm 6H side and the lower arm 6L side.

Seventh Embodiment

The present embodiment is a modification with the preceding embodiment as a basic form, and the description of the preceding embodiment can be incorporated.

Figure 23:
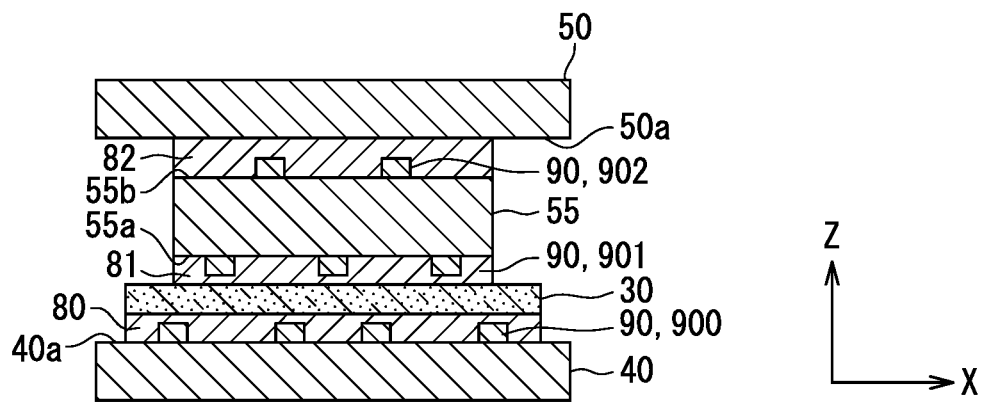
FIG. 23 is a schematic sectional view illustrating a laminate structure of one arm in a semiconductor device according to a seventh embodiment.
Figure 24:
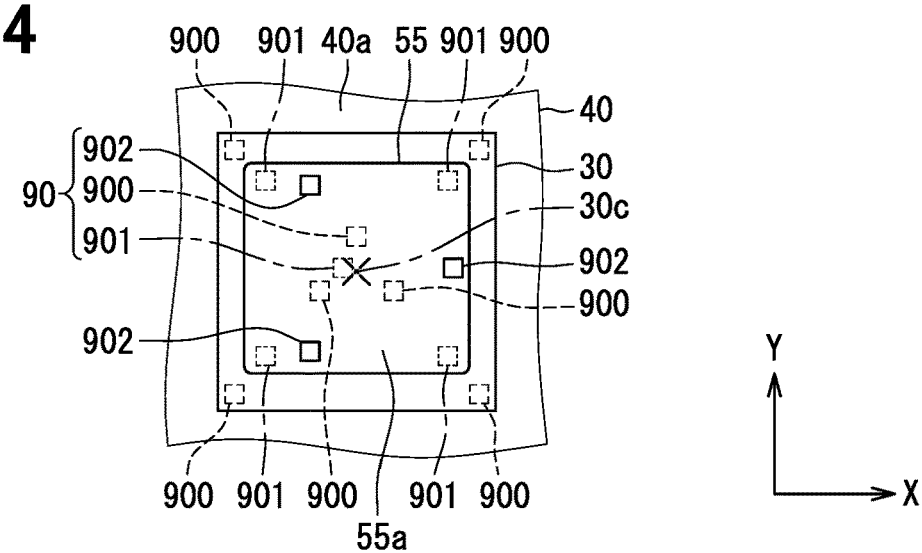
FIG. 24 is a plan view illustrating an arrangement of wire pieces in each solder.

As illustrated in FIG. 23, the wire piece 90 may be disposed in the solder 82. At this time, the wire pieces 90 of the solder 80, the solder 81, and the solder 82 may be arranged as illustrated in FIG. 24. FIG. 23 is a schematic sectional view illustrating a laminate between the heatsinks 40, 50 in the semiconductor device 10 according to the present embodiment. FIG. 24 is a plan view illustrating an example of a preferable arrangement of the wire pieces 90 in each of the solder 80, the solder 81, and the solder 82.

FIG. 24 corresponds to FIG. 21. In FIG. 24, the wire piece 900 is indicated by a broken line, and the wire piece 901 is indicated by a one-dot chain line. The configuration of the semiconductor device 10 of the present embodiment is, for example, similar to that in the first embodiment. The configurations illustrated in FIGS. 23 and 24 are substantially the same on the upper arm 6H side and the lower arm 6L side.

As illustrated in FIG. 23, a plurality of wire pieces 90 are arranged in each of the solder 80, the solder 81, and the solder 82. Hereinafter, the wire piece 90 disposed in the solder 80 may be referred to as a wire piece 900, the wire piece 90 disposed in the solder 81 may be referred to as a wire piece 901, and the wire piece 90 disposed in the solder 82 may be referred to as a wire piece 902. The number of wire pieces 90 is different among the solder 80, the solder 81, and the solder 82. The number of wire pieces 900 is the largest, and the number of wire pieces 902 is the smallest. The number of wire pieces 901 is smaller than the number of wire pieces 900 and larger than the number of wire pieces 902.

In FIG. 23, the wire piece 900 is fixed to the heatsink 40. The wire piece 901 is fixed to the first end face 55a of the terminal 55, and the wire piece 902 is fixed to the second end face 55b.

As illustrated in FIG. 24, the wire pieces 900 are arranged similarly to the wire pieces 90 (cf. FIG. 7) described in the first embodiment. The wire piece 900 is fixed to the mounting surface 40a of the heatsink 40. In the central region 80a of the solder 80, three wire pieces 900 are arranged to surround the element center 30c. In the outer peripheral region 80b, four wire pieces 900 are arranged corresponding to the four respective corners of the semiconductor element 30.

The wire pieces 901 are arranged similarly to the wire pieces 90 (cf. FIG. 17) described in the fifth embodiment. The wire piece 901 is fixed to the first end face 55a of the terminal 55. One wire piece 901 is disposed near the center of the first end face 55a. The wire pieces 901 are arranged at the four corners of the first end face 55a.

The wire piece 902 is fixed to the second end face 55b of the terminal 55. Three wire pieces 902 are fixed to the second end face 55b. The plurality of wire pieces 902 are arranged to surround the element center 30c. As illustrated in FIG. 24, the wire pieces 900, 901, 902 are arranged at positions not overlapping with each other in a plan view. The terminal 55 corresponds to a first wiring member, and the heatsink 50 corresponds to a second wiring member. The solder 81 corresponds to a first bonding member that is a front-side bonding member, and the solder 82 corresponds to a second bonding member.

Summary of Seventh Embodiment

In the present embodiment, a plurality of wire pieces 90 are arranged in the solder 82. It is thus possible to ensure the minimum film thickness of the solder 82. A plurality of wire pieces 90 are arranged in each of the solder 80, the solder 81, and the solder 82. Hence it is possible to ensure the minimum film thickness for all of the solder 80, the solder 81, and the solder 82 constituting the electrical conduction path and the thermal conduction path from the semiconductor element 30 to the heatsinks 40, 50 on both sides in the Z-direction.

In the present embodiment, the number of wire pieces 90 to be arranged is different among each of the solder 80, the solder 81, and the solder 82. The largest number of wire pieces 90 (wire pieces 900) are arranged in the solder 80 on the collector electrode 32 side having a large electrode area. On the emitter electrode 31 side having an electrode area smaller than that of the collector electrode 32, a smaller number of wire pieces 90 (wire pieces 901) than the wire pieces 900 are arranged in the solder 81 on the side closer to the semiconductor element 30. The smallest number of wire pieces 90 (wire pieces 902) are arranged in the solder 82 on the side far from the semiconductor element 30. Specifically, the semiconductor device 10 includes seven wire pieces 900, five wire pieces 901, and three wire pieces 902 as the wire pieces 90.

The solder 80 and the solder 81 are affected by the warpage of the semiconductor element 30. The largest number of wire pieces 90 are arranged in the solder 80 having the largest area in a plan view by the connection to the collector electrode 32, so that the minimum film thickness of the solder 80 can be ensured. By arranging the wire pieces 900 in the same manner as in the first embodiment, the minimum film thickness can be ensured against the warpage of the semiconductor element 30. The solder 81 connects the emitter electrode 31 having an area smaller than that of the collector electrode 32 and the terminal 55 that is a metal block body. By providing one wire piece 90 near the center, it is possible to cope with the upward warpage of the semiconductor element 30. The minimum film thickness of the solder 81 can be ensured by arranging the wire piece 90 in smaller number than those in the solder 80. By arranging the wire pieces 901 in the same manner as in the fifth embodiment, the minimum film thickness can be ensured even against the warpage of the semiconductor element 30.

The solder 82 connects the terminal 55 and the heatsink 50. The terminal 55 and the heatsink 50 are not warped unlike the semiconductor element 30. In addition, since the terminal 55 is present between the solder 82 and the semiconductor element 30, the solder 82 is not affected by the warpage of the semiconductor element 30. Hence the minimum film thickness of the solder 82 can be ensured with the smallest number of wire pieces 90. By making the number of the wire pieces 901 and the number of wire pieces 902 smaller than the number of the wire pieces 900, it is possible to reduce the gaps 86 in the solder 81 and solder 82 as compared to the configuration in which the number of the wire pieces 900 is the same. It is thus possible to ensure the heat dissipation while ensuring the minimum film thickness. Moreover, since the number of the wire pieces 902 is made smaller than that of the wire pieces 901, heat dissipation can be enhanced as compared to a configuration in which the number of the wire pieces 901 is the same. Also, the number of wire pieces 90 in the entire semiconductor device 10 can be reduced.

The wire pieces 900, 901, 902 are arranged at positions not overlapping with each other in a plan view. The gaps 86 do not overlap with each other in the Z-direction, or even when the gaps 86 overlap, the overlapping portion is very small, so that heat dissipation can be enhanced.

When the numbers of wire pieces 90 in the solder 80, the solder 81, and the solder 82 are made different from each other, the numbers are not limited to the above example. It is sufficient that the relationship of the number of wire pieces 900>the number of wire pieces 901>the number of wire pieces 902 be satisfied. The relationship may be the number of wire pieces 900>the number of wire pieces 901=the number of wire pieces 902. The relationship may be the number of wire pieces 900=the number of wire pieces 901>the number of wire pieces 902. By making some of the wire pieces 90 of the solder 80, the solder 81, and the solder 82 different from the remaining wire pieces 90, the effect is weakened, but the heat dissipation can be improved, and the wire pieces 90 can be reduced.

When the minimum film thickness is ensured in each of the solder 80, the solder 81, and the solder 82, the number of the wire pieces 90 can be set more freely. The number of wire pieces 90 in the solder 80, the solder 81, and the solder 82 may be the same. Arranging a plurality of wire pieces, preferably three or more wire pieces 90, facilitates ensuring the solder thickness.

The configuration of the present embodiment may be achieved by only one of the upper arm 6H side and the lower arm 6L side. Although the example in which the wire pieces 90 are arranged in the solder 80, the solder 81, and the solder 82 has been described, the wire piece may be further disposed on at least one of the solder 83 and the solder 84.

Eighth Embodiment

The present embodiment is a modification with the preceding embodiment as a basic form, and the description of the preceding embodiment can be incorporated.

Figure 25:
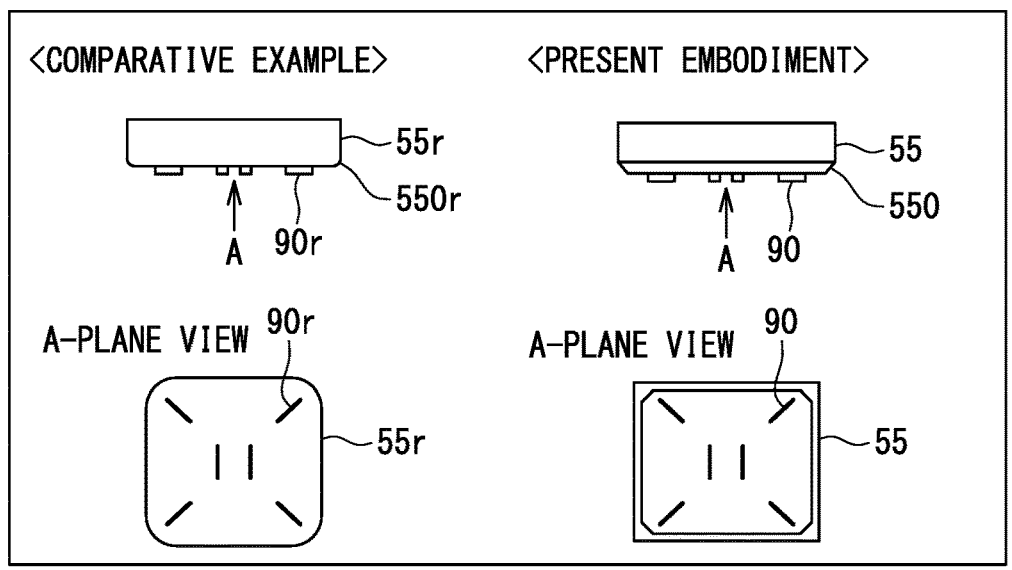
FIG. 25 is a view illustrating the difference in a terminal between a semiconductor device according to an eighth embodiment and a comparative example.

The shape of the terminal 55 is not particularly limited. Preferably, the wire piece 90 may have a shape illustrated in FIG. 25 as the present example. FIG. 25 is a schematic diagram illustrating the difference in the terminal between a comparative example and the present example (present embodiment). In the comparative example, the same or related elements as or to the elements of the present embodiment (the present example) are indicated by adding r to the end of the reference numerals in the present embodiment. In both the comparative example and the present example shown in FIG. 25, the upper figure is a side view and the lower figure is a plan view in an A-plane view. The semiconductor device 10 of the present embodiment is, for example, similar to that in the first embodiment. The configuration illustrated in FIG. 25 is substantially the same on the upper arm 6H side and the lower arm 6L side.

The terminal is formed by punching a metal plate by press working. The wire piece is formed by capturing an image of the end face of the terminal with a camera, recognizing a corner portion of the end face, and ultrasonically bonding a bonding wire to a predetermined position with the corner portion as a position reference. A terminal 55r of the comparative example has an R part 550r formed by punching at a corner of one end face in the Z-direction. Therefore, at the time of forming a wire piece 90r on the end face on the R part 550r side, there is a possibility that the accuracy of the formation position of the wire piece 90r becomes lower than that of the end face on the side where the R part 550r is not provided.

In the present embodiment (present example) as well, similarly to the comparative example. the terminal 55 in the punched state has an R part (not illustrated) at a corner of one end face. However, after the punching, chamfering of the R part, for example, C-chamfering, is performed. The C-chamfering is chamfering with a chamfering angle of approximately 45 degrees. The terminal 55 has a chamfering part 550.

Summary of Eighth Embodiment

As described above, the terminal 55 of the present embodiment has the chamfering part 550. Thus, when the wire piece 90 on the end face on the side where the R part is formed at the time of punching, the corner portion can be accurately recognized by imaging. Therefore, the wire piece 90 can be formed with high positional accuracy.

The configuration of the present embodiment can be applied to a configuration including the terminal 55. Combinations with each of the preceding embodiments are possible. Further, the connection target of the wire piece 90 is not limited to the terminal 55. The present embodiment can be applied to a member formed by punching a metal plate and in which an R part is formed at the time of punching. By chamfering the R part after the punching, the wire piece 90 can be formed with high positional accuracy on the surface on the side where the R part is formed at the time of punching.

Ninth Embodiment

The present embodiment is a modification with the preceding embodiment as a basic form, and the description of the preceding embodiment can be incorporated. The present embodiment is characterized by the structure and the manufacturing method of the wire piece 90.

As described above, the wire piece 90 is formed by ultrasonically bonding the aluminum-based bonding wire and cutting the wire at the point when the first bonding is performed. One of preferable forms of the wire piece 90 is illustrated in FIGS. 26 to 29.

Figure 26:
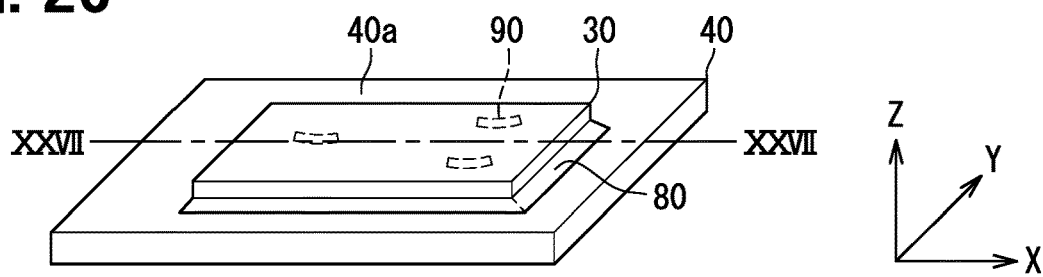
FIG. 26 is a perspective view illustrating an example of a connection structure between a semiconductor element and a heatsink in a semiconductor device according to a ninth embodiment.
Figure 27:
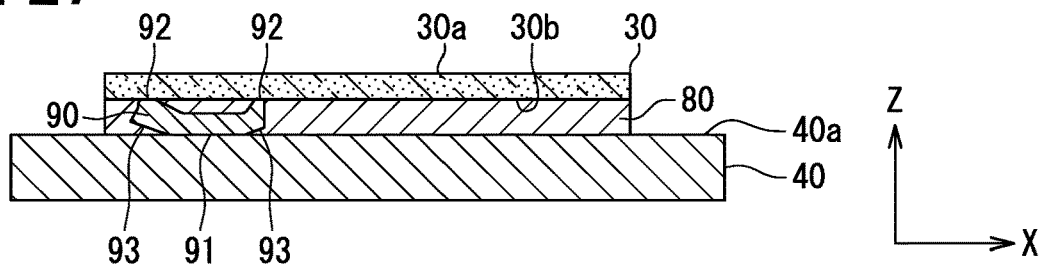
FIG. 27 is a sectional view taken along a line XXVII-XXVII of FIG. 26.
Figure 28:
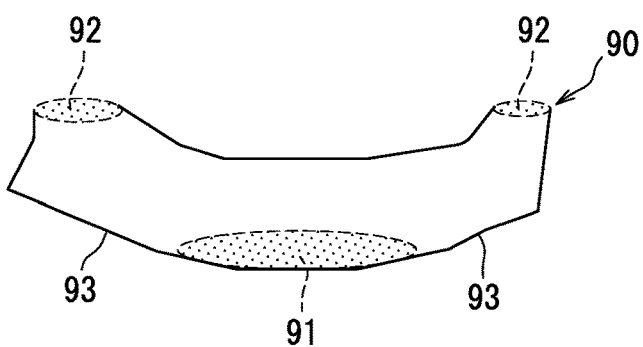
FIG. 28 is a perspective view illustrating a wire piece.
Figure 29:
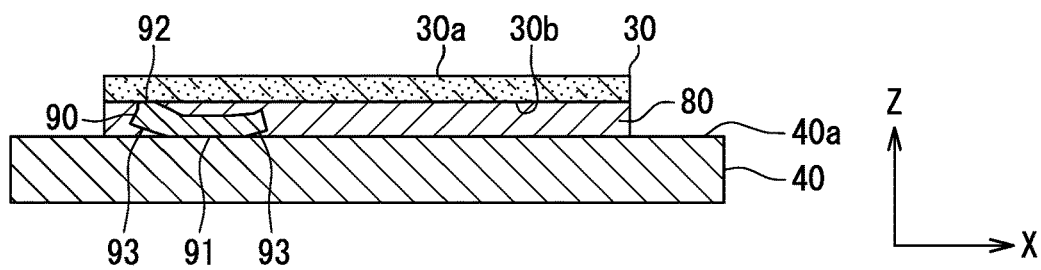
FIG. 29 is a sectional view illustrating another example of the wire piece.

FIG. 26 illustrates a connection structure between the semiconductor element 30 and the heatsink 40 in the semiconductor device 10 according to the present embodiment. FIG. 27 is a sectional view taken along a line XXVII-XXVII of FIG. 26. FIG. 28 is a perspective view illustrating the wire piece 90 applied to FIGS. 26 and 27. FIG. 29 illustrates another example of the wire piece 90. In FIGS. 26 and 27, the number of wire pieces 90 is three. In FIGS. 26, 27, and 28, the illustration of the main electrode is omitted for convenience. The semiconductor device 10 of the present embodiment is, for example, similar to that in the first embodiment. The configurations illustrated in FIGS. 26 to 28 are substantially the same on the upper arm 6H side and the lower arm 6L side.

The semiconductor element 30 has a front surface 30a on which the emitter electrode 31 (not illustrated) is formed and a back surface 30b on which the collector electrode 32 (not illustrated) is formed. The collector electrode 32 forms the back surface 30b. As illustrated in FIGS. 21 and 22, a plurality of wire pieces 90 are arranged in the solder 80. The wire piece 90 is bonded (fixed) to the mounting surface 40a of the heatsink 40. The mounting surface 40a corresponds to the fixing surface of the wiring member. The wire piece 90 protrudes from the mounting surface 40a toward the back surface 30b. The wire piece 90 is held by the heatsink 40. For this reason, the heatsink 40 may be referred to as a holder. The wire piece 90 includes a fixed part 91, a flat part 92, and a non-fixed part 93. The fixed part 91 is a portion fixed (a portion bonded) to the heatsink 40 on the side of the wire piece 90 facing the heatsink 40.

The flat part 92 is a portion that is formed on the side of the wire piece 90 facing the back surface 30b of the semiconductor element 30 and is substantially parallel to the mounting surface 40a of the heatsink. The non-fixed part 93 is a portion that is continuous with the fixed part 91 on the side of the wire piece 90 facing the heatsink 40 and is not fixed to the heatsink 40. The non-fixed part 93 is separated from the mounting surface 40a in the Z-direction. The non-fixed part 93 floats with respect to the fixed part 91. The wire piece 90 is provided to be elastically deformable in the Z-direction. The solder 80 enters a gap between the non-fixed part 93 and the mounting surface 40a. The wire piece 90 has a fixed part 91 and a non-fixed part 93 on the heatsink 40 side in the Z-direction and has a flat part 92 on the side opposite to the fixed part 91 and the non-fixed part 93.

The wire piece 90 extends in the X-direction. The wire piece 90 illustrated in FIGS. 27 and 28 has the flat part 92 and the non-fixed part 93 at both ends in the extending direction. The flat part 92 is provided at a position overlapping with the non-fixed part 93 in a plan view. The height from the mounting surface 40a to the flat parts 92 at both ends are substantially equal to each other. The wire piece 90 has a substantially U shape or a substantially C shape on the ZX plane. The flat parts 92 at both ends are in contact with the back surface 30b of the semiconductor element 30.

FIG. 29 illustrates another example of the wire piece 90. The wire piece 90 has the flat part 92 not at both ends but only at one end in the extending direction. The non-fixed part 93 is provided at both ends in the extending direction. In the wire piece 90, the heights from the mounting surface 40a to the upper portions of both ends are different. The flat part 92 is formed at the end on the side where the protrusion from the mounting surface 40a is higher. The wire piece 90 has a substantially J shape on the ZX plane. The flat part 92 is formed at the end on the side farther from the element center 30c (not illustrated).

<Manufacturing Method>

Next, a method for manufacturing the semiconductor device 10, particularly a method for manufacturing a connection body between the semiconductor element 30 and the heatsink 40, will be described. Here, an example of the wire piece 90 illustrated in FIG. 29 is illustrated.

Figure 30:
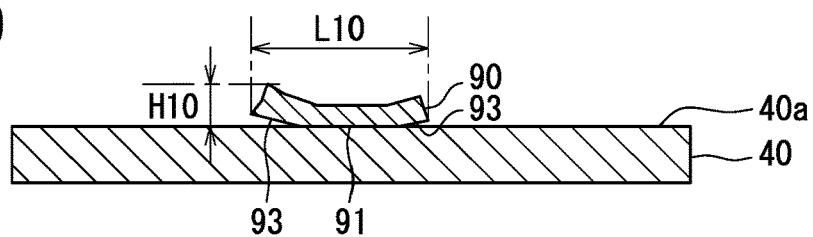
FIG. 30 is a sectional view illustrating a method for manufacturing the semiconductor device.

First, as illustrated in FIG. 30, the wire piece 90 is formed on the mounting surface 40a of the heatsink 40. The bonding wire is bonded to the heatsink 40 by ultrasonic waves from a tool (not illustrated) to form the fixed part 91. The fixed part 91 is a first bonding part. After the application of the ultrasonic wave is completed, the bonding wire is cut such that the non-fixed part 93 remains in front of and behind the fixed part 91 in the extending direction. In this manner, the bonding wire is cut without forming a second bonding part. Since the wire piece 90 is formed using only the first bond side, the formation time can be shortened as compared to a structure having two bonding bodies, that is, the first bonding part and the second bonding part. In addition, the size of the wire piece 90 can be reduced, for example, the extension length can be reduced. Hence it is also advantageous from the viewpoint of the solder deformation described above.

The bonding wire is a wire made of aluminum or an aluminum alloy as described above and can be selected in accordance with the size of the semiconductor element 30 or the thickness of the solder 80. Here, the wire piece 90 having a protrusion height of 110 μm from the mounting surface 40a and an extension length of 350 μm was formed using a bonding wire with a diameter of 80 μm.

Figure 31:
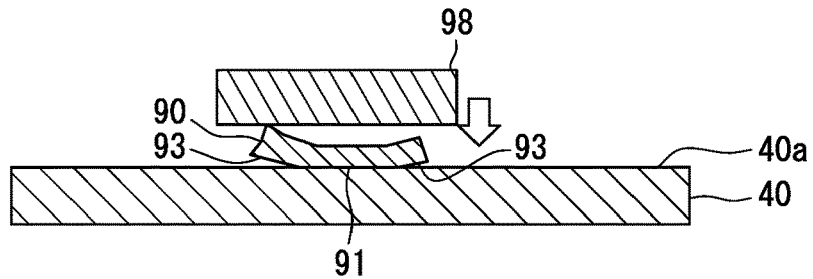
FIG. 31 is a sectional view illustrating the method for manufacturing the semiconductor device.
Figure 32:
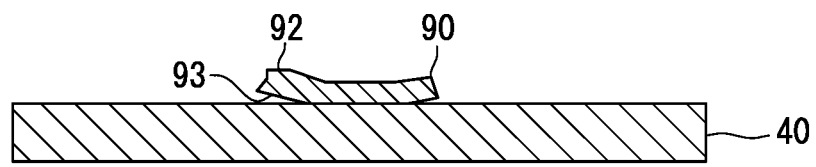
FIG. 32 is a sectional view illustrating the method for manufacturing the semiconductor device.

Next, as illustrated in FIGS. 31 and 32, the flat part 92 is formed in the wire piece 90. That is, a leveling process is performed. Specifically, a load is applied to the wire piece 90 as indicated by a white arrow in FIG. 31 by using a jig 98 having a surface (hereinafter referred to as a contact surface) parallel to the mounting surface 40a. For example, the jig 98 is attached to a press machine, and a load is applied to the wire piece 90. The jig 98 is pressed against the wire piece 90 while the contact surface and the mounting surface 40a are kept parallel to each other. The jig 98 is in contact with one end of the substantially J-shaped wire piece 90. The wire piece 90 is elastically deformed, and at least a part of the non-fixed part 93 comes into contact with the mounting surface 40a. When the jig 98 is further pressed, the wire piece 90 is plastically deformed to form the flat part 92. The wire piece 90 is plastically deformed in accordance with the pressing amount. The flat part 92 is formed on one end side that first comes into contact with the jig 98.

After the formation of the flat part 92, the wire piece 90 is restored from the elastically deformed state by the release of the load, and the portion of the non-fixed part 93 in contact is separated from the mounting surface 40a. Thus, as illustrated in FIG. 32, the wire piece 90 including the flat part 92 at a position overlapping with the non-fixed part 93 in a plan view is obtained. By the flattening, the wire piece 90 becomes lower than in the state of FIG. 30. Here, the height is about 75 µm. Through the above process, a plurality of wire pieces 90 are formed on the mounting surface 40a. In order to prevent the inclination of the semiconductor element 30, it is preferable to form a plurality of wire pieces, more preferably three or more wire pieces 90. More preferably, the configuration described in the preceding embodiment may be adopted.

Figure 33:
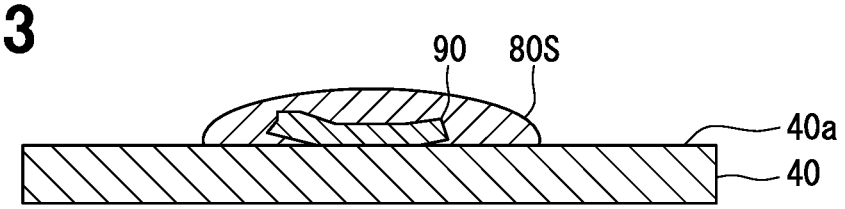
FIG. 33 is a sectional view illustrating the method for manufacturing the semiconductor device.

Next, as illustrated in FIG. 33, molten solder 80S is applied. The molten solder 80S is applied onto the mounting surface 40a of the heatsink 40. The wire piece 90 is covered with the applied molten solder 80S. Since it is necessary to dispose the semiconductor element 30 on the molten solder 80S, the heatsink 40 is heated (heated) as necessary. Here, the molten solder 80S was applied by a transfer method.

Figure 34:
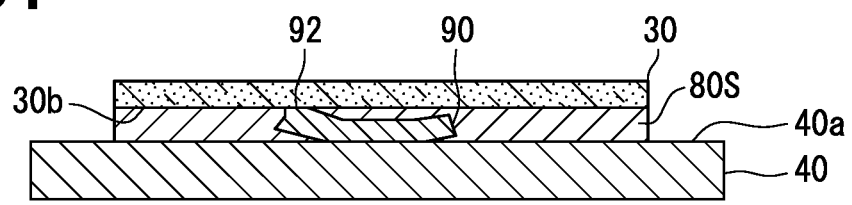
FIG. 34 is a sectional view illustrating the method for manufacturing the semiconductor device.

Next, as illustrated in FIG. 34, the semiconductor element 30 is mounted. The semiconductor element 30 is held by a jig (not illustrated) and lowered from above the mounting surface 40a toward the molten solder 80S. By lowering, the back surface 30b of the semiconductor element 30 comes into contact with the molten solder 80S, and presses and spreads the molten solder 80S. When the jig is lowered to the predetermined position, the holding state by the jig is released. The molten solder 80S wets and spreads on the back surface 30b and the mounting surface 40a. The semiconductor element 30 may be pressed against the wire piece 90 due to the thickness of the heatsink 40, the thickness and warpage of the semiconductor element 30, variations in mounting accuracy, and the like.

Then, the connection structure illustrated in FIG. 29 can be obtained through cooling (not illustrated). The wire piece 90 illustrated in FIGS. 27 and 28 can also be formed by a similar method. Specifically, after the fixed part 91 is formed, the bonding wire is cut such that the heights of both ends are substantially equal to form the wire piece 90, and the flat parts 92 may be formed at both ends by the jig 98.

Summary of Ninth Embodiment

When the wire piece 90 having no flat part, that is, the wire piece 90 in the state illustrated in FIG. 30, is used, stress concentrates on the semiconductor element 30 when the semiconductor element 30 comes into contact with the wire piece 90. In particular, when the height variation of the wire piece 90 is large, the possibility that the semiconductor element 30 comes into contact with the wire piece 90 increases. In contrast, by using the wire piece 90 of the present embodiment, the semiconductor element 30 comes into contact with the flat part 92, so that stress concentration can be prevented. Further, the height variation of the wire piece 90 is reduced by forming the flat part 92. As a result, the thickness of the solder 80 is stabilized, and connection reliability can be enhanced. For example, a solder crack life under a temperature cycle environment can be ensured.

Since the wire piece 90 having the flat part 92 can be formed by a wire bonding technique and simple pressing, the cost can also be reduced.

The wire piece 90 includes the non-fixed part 93. Thereby, the wire piece 90 can be deformed elastically. Thus, even when the semiconductor element 30 comes into contact with the wire piece 90, the stress concentration of the semiconductor element 30 can be prevented due to the elastic change of the wire piece 90. In particular, in the present embodiment, the flat part 92 is formed at a position overlapping with the non-fixed part 93 in a plan view. This facilitates the flat part 92 in contact with semiconductor element 30 to be deformed in the direction in which the stress is released. Therefore, it is more effective for preventing stress concentration.

The arrangement of the wire piece 90 is not limited to the above example. FIGS. 35 to 38 illustrate other examples. In each of the examples illustrated in FIGS. 35 to 38, two wire pieces 90 are arranged in one cross section including the Z-direction. The wire piece 90 is in contact with the semiconductor element 30.

Figure 35:
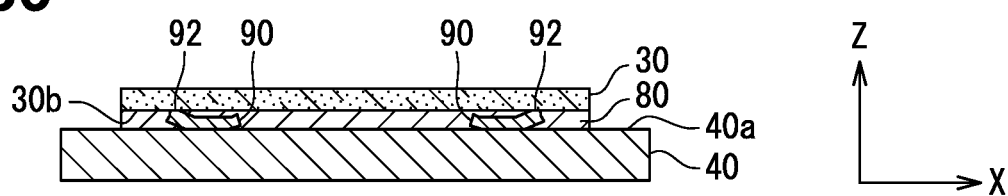
FIG. 35 is a sectional view illustrating an example of a semiconductor element without warpage.
Figure 36:
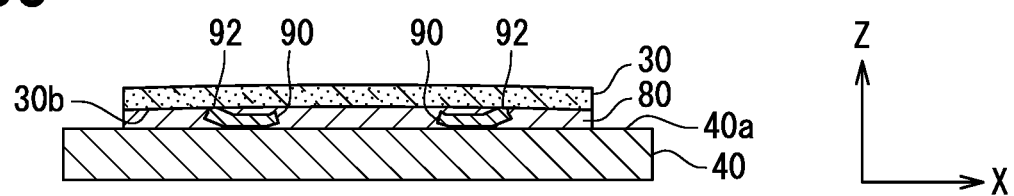
FIG. 36 is a sectional view illustrating an example of a semiconductor element having warped upward.
Figure 37:
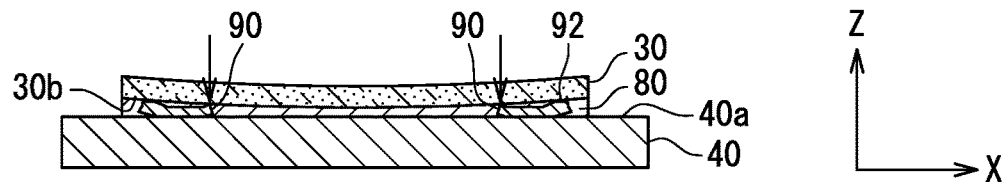
FIG. 37 is a sectional view illustrating an example of a semiconductor element having warped downward.

In the example illustrated in FIGS. 35 to 37, each of the two wire pieces 90 has only one flat part 92 similarly to the wire piece 90 illustrated in FIG. 29. The flat part 92 is formed at each of the outer ends in the arrangement direction (X-direction) of the two wire pieces 90. As illustrated in FIG. 35, when the semiconductor element 30 is not warped, the flat parts 92 of both the wire pieces 90 come into contact with the semiconductor element 30. Therefore, stress concentration in the semiconductor element can be prevented.

As illustrated in FIG. 36, even when the semiconductor element 30 warps upward, the flat part 92 of the wire piece 90 comes into contact with the semiconductor element 30. Therefore, stress concentration in the semiconductor element can be prevented. On the other hand, as illustrated in FIG. 37, when the semiconductor element 30 warps downward, the inner end of the wire piece 90 comes into contact with the semiconductor element 30 as indicated by a solid arrow in the figure. As described above, depending on the warpage amount, the semiconductor element 30 may hit the end on the side where the flat part 92 is not formed.

The flat part 92 may be formed at the end of the wire piece 90. According to this, even when the warpage illustrated in FIG. 37 has occurred, the flat part 92 provided at the inner end comes into contact with the semiconductor element 30, so that stress concentration can be prevented. However, in a case where the semiconductor element 30 having an upward concave surface and the semiconductor element 30 having a downward concave surface are mixed in the same assembling lot, for example, when the position of the flat part 92 is aligned with the semiconductor element 30 having the upward convex surface, stress may concentrate on the semiconductor element 30 having the downward convex surface.

Figure 38:
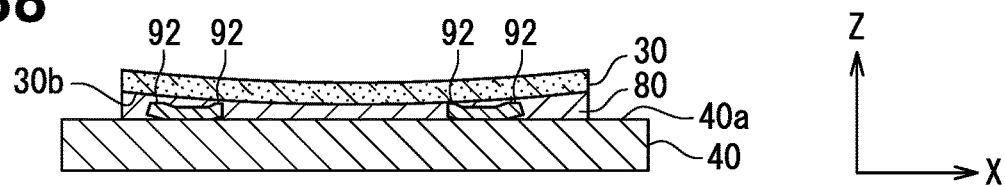
FIG. 38 is a sectional view illustrating an effect of having flat parts at both ends.

In contrast, in the example illustrated in FIG. 38, the two wire pieces 90 have flat parts 92 at both ends similarly to the wire pieces 90 illustrated in FIGS. 27 and 28. Therefore, when the semiconductor element 30 warps downward, the inner flat part 92 comes into contact with the semiconductor element 30. Although not illustrated, when the semiconductor element 30 warps upward, the outer flat part 92 comes into contact with the semiconductor element 30. Therefore, stress concentration can be prevented regardless of the direction of warpage of the semiconductor element 30.

Figure 39:
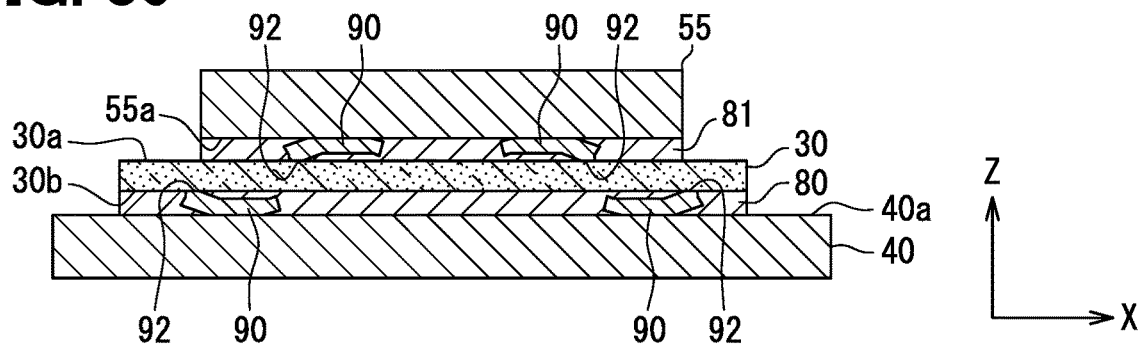
FIG. 39 is a sectional view illustrating another example of the semiconductor device.

The configuration of the wire piece 90 of the present embodiment is not limited to the wire piece 90 disposed in the solder 80. The configuration can be applied to any wire piece 90 provided in the solder bonding part between the main electrode and the wiring member. For example, in an example illustrated in FIG. 39, the wire piece 90 is disposed in the solder 81 between the emitter electrode 31 and the terminal 55 (not illustrated), and the flat part 92 is also formed in the wire piece 90. In FIG. 39, the flat part 92 is formed only at one end of the wire piece 90, but it goes without saying that the flat parts 92 may be formed at both ends.

The present embodiment can also be applied to a configuration in which the terminal 55 is not provided and a solder bonding part is formed between the heatsink 50 and the emitter electrode 31. In this case, the wire piece 90 bonded to the mounting surface 50a only needs to have the flat part 92. The present embodiment can also be applied to a configuration including only one of the front-side wiring member and the back-side wiring member.

The structure of the wire piece 90 described in the present embodiment can be combined with the wire piece 90 of the preceding embodiment. Further, the method for manufacturing the wire piece 90 described in the present embodiment can be applied to the formation of the wire piece 90 described in the preceding embodiment. Although the example in which the wire piece 90 includes the non-fixed part 93 has been described, the present disclosure is not limited thereto. At least the flat part 92 may be provided. The flat part 92 may be provided at a position not overlapping with the non-fixed part 93 in a plan view. The present embodiment can be applied to a wire piece disposed in a bonding part between the main electrode of the semiconductor element and the wiring member. The arrangement of the wire pieces is not limited to the arrangement described in the preceding embodiment.

Tenth Embodiment

The present embodiment is a modification with the preceding embodiment as a basic form, and the description of the preceding embodiment can be incorporated. In the present embodiment as well, a preferred embodiment of the wire piece 90 will be described.

<Magnitude of Wire Piece>

First, a preferable magnitude of the wire piece 90 will be described with reference to FIGS. 40 to 43. The wire piece 90 is disposed in a solder that connects the main electrode of the semiconductor element 30 and the wiring member. The solder here is, for example, the solder 80 and the solder 81.

Figure 40:
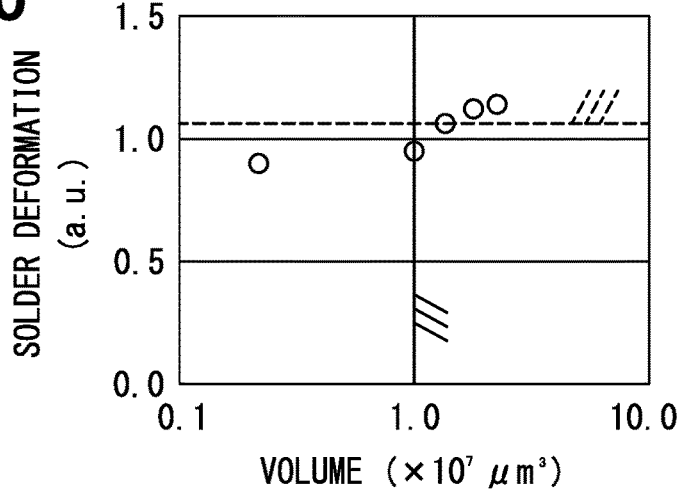
FIG. 40 is a simulation result illustrating a relationship between a volume of a wire piece and solder deformation in the semiconductor device according to a tenth embodiment.
Figure 41:
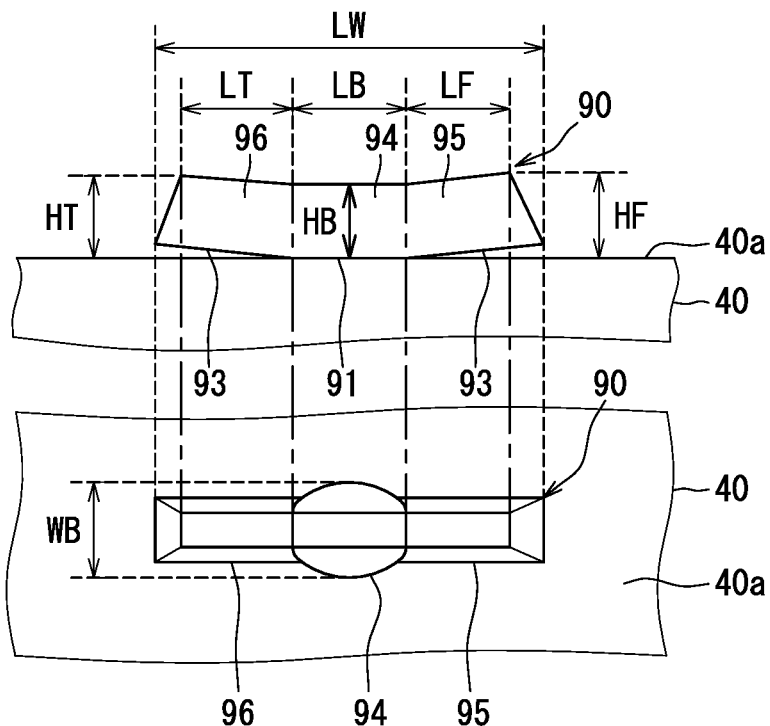
FIG. 41 is a view illustrating the structure of the wire piece.
Figure 42:
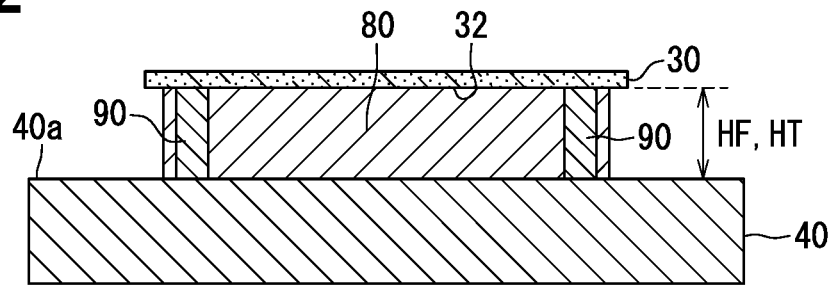
FIG. 42 is a sectional view for explaining the height of the wire piece between a collector electrode and the heatsink.
Figure 43:
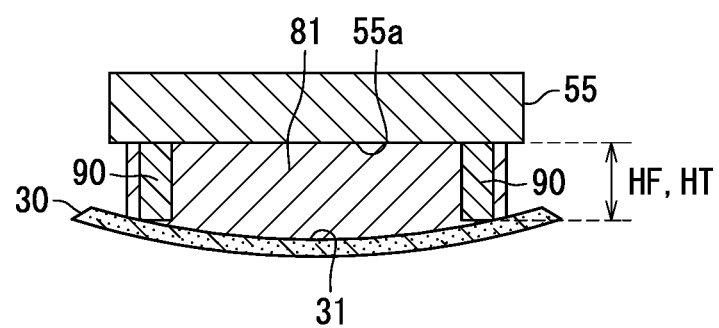
FIG. 43 is a sectional view for explaining the height of the wire piece between the emitter electrode and the terminal.

FIG. 40 is a simulation result illustrating the relationship between the volume of the wire piece 90 and the solder deformation. The horizontal axis represents the volume ($\times 10^7$ $\mu m^3$) of the wire piece 90, and the vertical axis represents the solder deformation (arbitrary unit). The horizontal axis is a logarithmic axis. FIG. 41 is a diagram illustrating the wire piece 90 of the present embodiment. In FIG. 41, the upper part of the page is a side view, and the lower part of the page is a top plan view. FIG. 42 is a sectional view for explaining the maximum height of the wire piece 90 disposed in the solder 80. FIG. 43 is a sectional view for explaining the maximum height of the wire pieces 90 arranged in the solder 81.

From the simulation result illustrated in FIG. 40, it has become clear that when the volume of the wire piece 90 is large, thermal stress based on the difference in a linear expansion coefficient between the wire piece 90 and the solder, that is, solder deformation, increases, and when the volume exceeds a predetermined volume, element damage such as a crack occurs. When the solder deformation becomes a value equal to or more than a broken line illustrated in FIG. 40, the element damage occurs. Thus, for preventing the element damage, it is preferable to set the volume of the wire piece 90 to $1.0 \times 10^7$ $\mu m^3$ or less. In the semiconductor device 10 of the present embodiment, the volume of each wire piece 90 is set to $1.0 \times 10^7$ $\mu m^3$ or less.

Next, a description will be given of a configuration in which the height variation of the wire piece 90 can be prevented without performing the leveling process while the volume relationship described above is satisfied. Hereinafter, the wire piece 90 connected to the heatsink 40 will be exemplified.

As illustrated in FIG. 41, the wire piece 90 is divided into three portions in the extending direction. The wire piece 90 includes a bonding part 94, a feed part 95, and a tail part 96. The bonding part 94 is located between the feed part 95 and the tail part 96 in the extending direction of the wire piece 90. The bonding part 94 is a portion bonded to the heatsink 40. The bonding part 94 has a fixed part 91 on the side facing the heatsink 40. The bonding part 94 includes the fixed part 91 and is a portion overlapping with the fixed part 91 in a plan view. That is, the bonding part 94 is a portion immediately above the fixed part 91 and the fixed part 91. The bonding part 94 corresponds to a bonding part. The bonding part 94 is crushed by receiving a load from the tool at the time of ultrasonic bonding. Hence the bonding part 94 is wider than the feed part 95 and the tail part 96.

The feed part 95 is continuous with the bonding part 94 on the tip side of the wire piece 90. The feed part 95 is a portion that is not bonded to the heatsink 40. The feed part 95 has a non-fixed part 93 on the side facing the heatsink 40. The feed part 95 is a portion including the non-fixed part 93 on the tip side and overlapping with the non-fixed part 93 in a plan view. That is, the feed part 95 is the non-fixed part 93 on the tip side and a portion immediately above the non-fixed part 93. The feed part 95 does not have the flat part 92 on the side facing the semiconductor element 30 (not illustrated).

The tail part 96 is continuous with the bonding part 94 on the rear end side of the wire piece 90. Similar to the feed part 95, the tail part 96 is also a portion not bonded to the heatsink 40. The tail part 96 has the non-fixed part 93 on the side facing the heatsink 40. The tail part 96 is a portion including the non-fixed part 93 on the rear end side and overlapping with the non-fixed part 93 in a plan view. That is, the tail part 96 is the non-fixed part 93 on the rear end side and a portion immediately above the non-fixed part 93. The tail part 96 does not have a flat part 92 on the side facing the semiconductor element 30 (not illustrated).

The feed part 95 and the tail part 96 correspond to a non-bonding part. The tip side is the side having the end (cut end) before the ultrasonic bonding. The rear end side is the end side formed by cutting the bonding wire after the ultrasonic bonding. Although not illustrated, the heatsink 40 has a cutter mark generated when the bonding wire is cut immediately below the rear end of the wire piece 90.

Hereinafter, the length of the bonding part 94 in the extending direction may be referred to as LB, the length of the feed part 95 in the extending direction may be referred to as LF, and the length of the tail part 96 in the extending direction may be referred to as LT. The length (total length) of the wire piece 90 in the extending direction may be referred to as LW, and the width of the bonding part 94 may be referred to as WB. The width WB is the length of the bonding part 94 in a direction orthogonal to the extending direction. The height of the bonding part 94 may be denoted by HB, the height of the feed part 95 may be denoted by HF, and the height of the tail part 96 may be denoted by HT. As illustrated in FIG. 41, the length LF of the feed part 95 and the length LT of the tail part 96 are not the lengths on the side (lower surface side) facing the heatsink 40 but the lengths on the side (upper surface side) facing the semiconductor element 30. The height is a height of a portion farthest in the Z-direction from the first facing surface that is the bonding surface.

When the wire piece 90 is formed using a bonding wire having a diameter of 80 µm, the length LB of the bonding part 94 is substantially the same in the configuration including the flat part 92 and the present embodiment. For example, the length LB is 260 µm±100 µm. In order to set the volume of the wire piece 90 to $1.0 \times 10^7$ µm$^3$ or less, the total length LW of the wire piece 90 is preferably set to 400 µm or more and 450 µm or less, and the lengths LF, LT of the feed part 95 and the tail part 96 are preferably set to 100 µm or less.

In the configuration in which the flat part 92 is provided, a length for ensuring the flat part 92 in the extending direction is required. When the flat parts 92 are provided on both end sides, the total length of the wire piece 90 exceeds 450 µm, for example, about 500 µm. In the present embodiment, since the flat part 92 is not provided, each of the lengths LF, LT of the feed part 95 and the tail part 96, which are non-bonding parts, can be reduced to 100 µm or less. Therefore, even when the length LB varies, the total length LW of the wire piece 90 can be set to 450 µm or less. That is, the wire piece 90 can be reduced in size. It is thus easy to set the volume of the wire piece 90 to $1.0 \times 10^7$ µm$^3$ or less. In addition, with the lengths LF, LT being small, variations in the heights HF, HT can be prevented.

Furthermore, the height HF of the feed part 95 and the height HT of the tail part 96 may be set to 80 µm or more and 100 µm or less. The height of 80 µm is equal to the wire diameter. In this case, the feed part 95 and the tail part 96 are in contact with, but not bonded to, the mounting surface 40a of the heatsink 40.

When the semiconductor element 30 can be warped downward, as illustrated in FIG. 42, the volume of the space in which the semiconductor element 30 without warpage and the heatsink 40 face each other is maximum. When the volume of the facing space is maximum, the largest amount of solder is required as the solder 80 for ensuring a bonding area where the solder wets and spreads on almost the entire surface of the collector electrode 32. The volume of the necessary solder is minimized in a state where the semiconductor element 30 is supported by the wire pieces 90. The minimum value of the required solder volume is a value obtained by excluding the sink of the solder 80 from the volume of the portion overlapping with the semiconductor element 30 (collector electrode 32) in a plan view when the thickness of the solder 80 is equal to the heights HF, HT.

When the heights HF, HT are set to 110 µm or more, the predetermined supply amount of the solder 80 may fall below the minimum value of the required solder volume. This is apparent from the simulation results. In this case, there is a possibility that the solder 80 wets and spreads only on a part of the collector electrode 32. When the solder heights HF, HT are set to 100 µm or less, the predetermined supply amount of the solder 80 exceeds the minimum value of the required solder volume. As a result, the solder 80 wets and spreads over almost the entire surface of the collector electrode 32, and connection reliability can be ensured.

The same applies to the solder 81 on the emitter electrode 31 side. In a case where the semiconductor element 30 can warp downward, as illustrated in FIG. 43, when the warpage is maximum (e.g., 0.1 µm), the volume of the space in which the semiconductor element 30 and the terminal 55 face each other is maximum. When the volume of the facing space is maximum, the largest amount of solder is required as the solder 81 for ensuring a bonding area where the solder wets and spreads on almost the entire surface of the emitter electrode 31. The volume of the necessary solder is minimized in a state where the semiconductor element 30 is supported by the wire pieces 90.

When the heights HF, HT are set to 110 µm or more, the predetermined supply amount of the solder 80 may fall below the minimum value of the required solder volume. This is apparent from the simulation results. In this case, there is a possibility that the solder 81 wets and spreads only on a part of the emitter electrode 31. When the solder heights HF, HT are set to 100 µm or less, the predetermined supply amount of the solder 81 exceeds the minimum value of the required solder volume. As a result, almost the entire surface of the emitter electrode 31 wets and spreads through the solder 81, and connection reliability can be ensured.

As illustrated in the preceding embodiment (cf. FIG. 14), even in a case where the semiconductor element 30 having the downward convex surface is disposed in an inclined manner, when the heights HF, HT are 70 µm or more, the minimum film thicknesses of the solder 80 and the solder 81 can be ensured by the wire pieces 90 (cf. FIGS. 12 and 20) arranged at least at the four corners. The minimum film thickness with which connection reliability can be ensured is, for example, 43 µm. In the present embodiment, the wire diameter is 80 µm, and the minimum value of each of the heights HF, HT is 80 µm. Therefore, even when the semiconductor element 30 having the downward convex surface is disposed in an inclined manner, connection reliability can be ensured.

When the lengths LF, LT are reduced as described above, the ratio (LF/LB, LT/LB) of each of the lengths LF, LT of the feed part 95 or the tail part 96 to the length LB of the bonding part 94 is smaller than that in the configuration in which the flat part 92 is provided. In order to set the volume of the wire piece 90 to $1.0 \times 10^7$ µm$^3$ or less, it is preferable to set LF/LB and LT/LB to 0.1 or more and 0.65 or less. By satisfying this relationship, the lengths of the feed part 95 and the tail part 96 can be reduced with respect to the bonding part 94, and the wire piece 90 can be reduced in size. Further, it is possible to prevent variations in the heights HF, HT.

A ratio (WB/LB) of the width WB of the bonding part 94 to the length LB of the bonding part 94 may be set to 0.2 or more and 0, 7 or less. That is, the width WB may be narrowed. Thus, the volume of the wire piece 90 can be reduced. Further, it is possible to prevent variations in the heights HF, HT.

More specifically, the wire piece 90 may be formed to achieve the following dimensions. The total length LW of the wire piece 90 may be 420 µm±20 µm, the length LF of the feed part 95 may be 85 µm±15 µm, and the length LT of the tail part 96 may be 70±30 µm. The length LB of the bonding part 94 may be 260 µm±100 µm, the height HB of the bond part may be 70 µm±5 µm, and the width WB of the bonding part 94 may be 90 µm+15 µm−5 µm. The height HF of the feed part 95 may be 85 µm+15 µm−5 µm, and the height HT of the tail part 96 may be 85 µm±5 µm.

<Method for Manufacturing Wire Piece>

Next, a method for manufacturing the wire piece 90 that achieves the volume and dimension described above will be described with reference to FIGS. 44 to 48. Hereinafter, an example in which the wire piece 90 is provided on the heatsink 40 will be described, but the same applies to the terminal 55.

Figure 44:
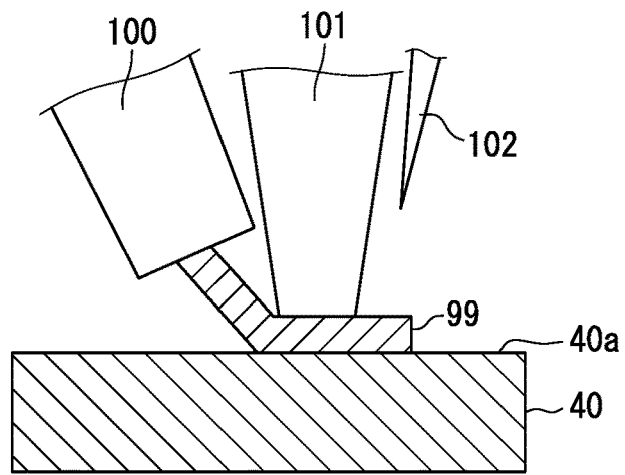
FIG. 44 is a sectional view illustrating a method for manufacturing the wire piece.

As illustrated in FIG. 44, an ultrasonic bonding apparatus includes a wire guide 100, a tool 101, and a cutter 102. First, a bonding wire 99 pulled out from the wire guide 100 is disposed at a predetermined position on the mounting surface 40a of the heatsink 40. At this time, the bonding wire 99 is disposed such that the feed part 95 having the predetermined length described above can be ensured with reference to the place of bonding by the tool 101.

Figure 45:
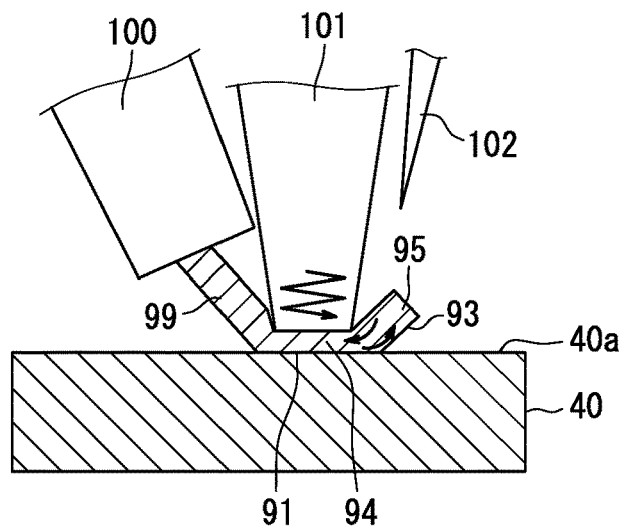
FIG. 45 is a sectional view illustrating the method for manufacturing the wire piece.

Next, as illustrated in FIG. 45, ultrasonic bonding is performed by the tool 101. The bonding part 94 is formed by ultrasonic bonding. The bonding wire 99 is more or less crushed by the power of ultrasonic bonding and the load by the tool 101. This leads to an increase in the width of the bonding part 94. In the present embodiment, the power and the load are adjusted such that the width WB of the bonding part 94 is not excessively widened and falls within the range of 90 µm+15 µm−5 µm, that is, 85 µm to 105 µm.

By ultrasonic bonding, compressive stress acts on the upper surface side of the feed part 95 as indicated by an arrow in FIG. 45. On the other hand, tensile stress acts on the lower surface side of the feed part 95, that is, the heatsink 40 side. Thus, the feed part 95 bounces against the mounting surface 40a of the heatsink 40. The portion of the non-fixed part 93 in contact is separated from the mounting surface 40a.

Figure 46:
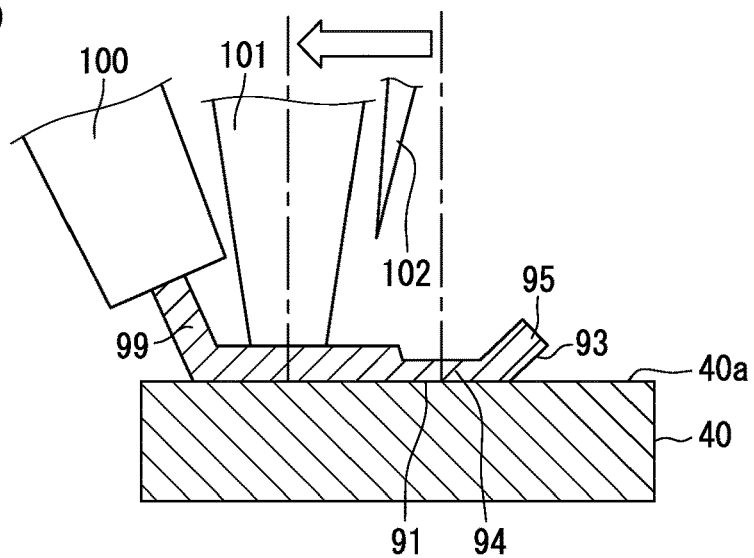
FIG. 46 is a sectional view illustrating the method for manufacturing the wire piece.

After the ultrasonic bonding is completed, the tool 101 (ultrasonic bonding apparatus) is retracted as illustrated in FIG. 46. The retraction amount of the tool 101 indicated by a white arrow in FIG. 46 is determined in accordance with the cutting position of the cutter 102, that is, the length of the tail part 96. Specifically, the retraction amount is determined such that the length LT of the tail part 96 and the entire length of the wire piece 90 each have a predetermined length.

Figure 47:
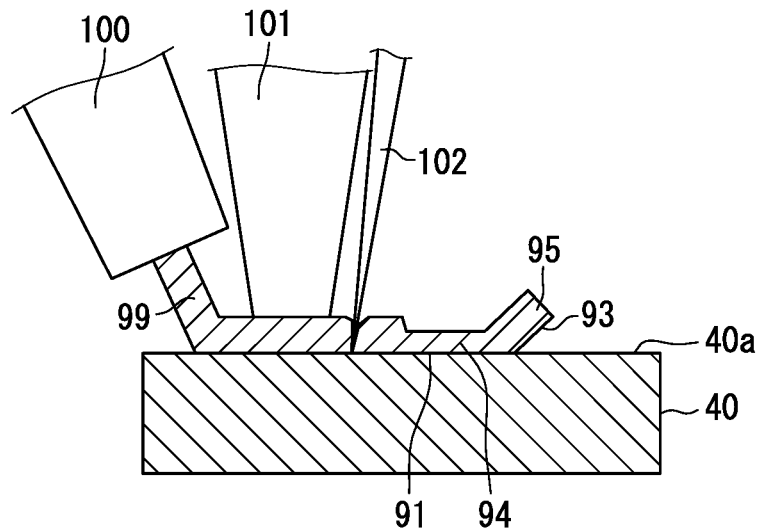
FIG. 47 is a sectional view illustrating the method for manufacturing the wire piece.
Figure 48:
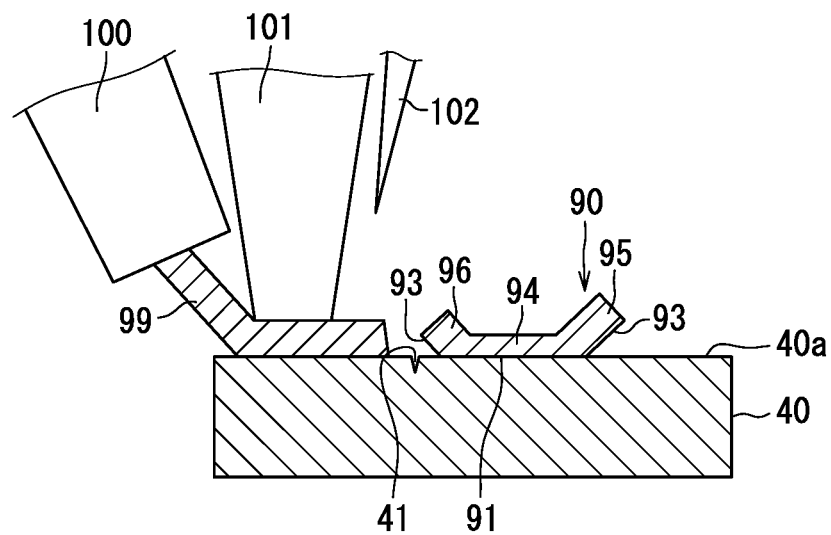
FIG. 48 is a sectional view illustrating the method for manufacturing the wire piece.

Next, as illustrated in FIG. 47, wire cutting is performed. The bonding wire 99 is cut by the cutter 102 in a state where the tool 101 presses the bonding wire 99 at the retracted position described above. The wire piece 90 is formed by wire cutting. After the wire cutting, the ultrasonic bonding apparatus including the tool 101 is retracted as illustrated in FIG. 48. The load is released by the cutting, and the tail part 96 of the wire piece 90 is restored from the elastically deformed state and bounces against the mounting surface 40a of the heatsink 40. The portion of the non-fixed part 93 in contact is separated from the mounting surface 40a.

As illustrated in FIG. 48, a cutter mark 41 is formed on the heatsink 40 by wire cutting. The cutter mark 41 is formed immediately below the tail part 96 at one of both ends of the wire piece 90 in the extending direction.

Summary of Tenth Embodiment

In the present embodiment, the volume of the wire piece 90 is set to $1.0 \times 10^7$ µm$^3$ or less. As a result, it is possible to reduce thermal stress and thus prevent the element damage. That is, it is possible to improve the reliability of the semiconductor device 10.

In the preceding embodiment (cf. FIG. 28), the volume relationship described above may be satisfied. However, when the flat parts 92 are provided on both end sides, the total length LW of the wire piece 90 becomes large. In addition, when the leveling process is not performed, a variation in the wire height, that is, the heights HF, HT, is large. As the leveling process is required, the number of steps, and thus the number of manufacturing steps, increases.

In the present embodiment, in order to satisfy the volume relationship described above, the total length LW of the wire piece 90 is set to 400 µm or more and 450 µm or less, and the lengths LF, LT of the feed part 95 and the tail part 96 are set to 100 µm or less. Since the flat part 92 is not provided, the lengths LF, LT of the feed part 95 and the tail part 96 and the total length LW of the wire piece 90 can be reduced. In addition, the leveling process is unnecessary, and for example, manufacturing cost can be reduced.

In particular, the lengths LF, LT of the feed part 95 and the tail part 96 are reduced with respect to the length LB of the bonding part 94. Specifically, LF/LB and LT/LB are set to 0.1 or more and 0.65 or less. This makes it possible to prevent variations in the heights HF, HT.

In the present embodiment, the height HF of the feed part 95 and the height HT of the tail part 96 are set to 80 µm or more and 100 µm or less. This makes it possible to ensure connection reliability.

In the present embodiment, the ratio (WB/LB) of the width WB of the bonding part 94 to the length LB of the bonding part 94 is set to 0.2 or more and 0, 7 or less. Since the width WB is narrowed, the volume of the wire piece 90 can be reduced. In addition, in order to narrow the width WB, power and load at the time of ultrasonic bonding are held within ranges in which bonding strength can be ensured. As a result, it is possible to reduce the amount of crushing and thus prevent and variations in the heights HF, HT.

The wire piece 90 having no flat part 92 illustrated in the present embodiment can be combined with each of the first to eighth embodiments. For example, it is suitable for a configuration in which the wire pieces 90 are arranged only at the four corners illustrated in FIGS. 12 and 20. The present embodiment can be applied to a wire piece disposed in a bonding part between the main electrode of the semiconductor element and the wiring member. The arrangement of the wire pieces is not limited to the arrangement described in the preceding embodiment.

OTHER EMBODIMENTS

Although the example in which the semiconductor device 10 is applied to the inverter 5 has been described, the present disclosure is not limited thereto. For example, the present disclosure can also be applied to a converter. The present disclosure can also be applied to both the inverter 5 and the converter.

Although the example in which the semiconductor element 30 includes the IGBT 6i and the FWD 6d constituting one arm has been described, the present disclosure is not limited thereto. The IGBT 6i and the FWD 6d may be separate chips (separate elements). Although the example of the IGBT 6i has been shown as the switching element, the present disclosure is not limited thereto. For example, a MOSFET can also be adopted. In addition, a diode can also be adopted as an element with a vertical structure having main electrodes on both surfaces.

A plurality of semiconductor elements 30H may be provided, and the plurality of semiconductor elements 30H may be connected in parallel to form one of the upper arms 6H. A plurality of semiconductor elements 30L may be provided, and the plurality of semiconductor elements 30L may be connected in parallel to form one of the lower arms 6L.

Although the example in which the back surfaces 40*b*, 50*b* of the heatsinks 40, 50 are exposed from the sealing resin body 20 has been described, the present disclosure is not limited thereto. At least one of the back surfaces 40*b*, 50*b* may be covered with the sealing resin body 20. At least one of the back surfaces 40*b*, 50*b* may be covered with an insulating member (not illustrated) different from the sealing resin body 20. Although the example in which the semiconductor device 10 includes the sealing resin body 20 has been described, the present disclosure is not limited thereto. The sealing resin body 20 may not be provided.

The example in which the semiconductor device 10 includes the plurality of semiconductor elements 30 constituting the upper and lower arm circuit 6 for one phase has been described, but the present disclosure is not limited thereto. Only the semiconductor element constituting one arm may be provided. It is sufficient that the semiconductor device 10 include, for example, a semiconductor element 30 constituting one arm and a pair of heatsinks 40, 50 disposed to sandwich the semiconductor element 30. Further, the semiconductor elements constituting the upper and lower arm circuit 6 for three phases may be provided as one package.

Although the example in which the signal terminal 75 is connected to the pad 33 via the bonding wire 87 has been described, the present disclosure is not limited thereto. For example, the signal terminal 75 may be connected to the pad 33 via solder. Since a space for the bonding wire 87 is unnecessary, a configuration without the terminal 55 can be adopted.

Although the example in which the groove 51 is provided in the heatsink 50 and the groove 63 is provided in the couplings 61, 62 has been described, the present disclosure is not limited thereto. At least one of the grooves 51, 63 may be eliminated. The example in which the coupling portion coupling between the upper arm 6H and the lower arm 6L is realized by the connection structure of the two couplings 60, 61 has been described, but the present disclosure is not limited thereto. A coupling continuous with one of the heatsinks 40L, 50H may be connected to the other. The example in which the coupling 62 is provided has been described, but the present disclosure is not limited thereto. The main terminal 71 may be continuous with the heatsink 50L without interposing the coupling 62.

While the present disclosure has been described in accordance with the above embodiments, it is understood that the present disclosure is not limited to the above embodiments and structures. The present disclosure embraces various changes and modifications within the range of equivalency. In addition, various combinations and modifications and other combinations and modifications including only one element or more or less than one element are within the scope and sprit of the present disclosure.

What is claimed is:

1. A semiconductor device comprising:
    a semiconductor element having a front surface and a back surface opposite to the front surface in a plate thickness direction of the semiconductor element, the semiconductor element including, as main electrodes, a front electrode on the front surface and a back electrode on the back surface, the back electrode having an area larger than an area of the front electrode;
    a wiring member disposed to face the semiconductor element;
    a bonding member disposed between a first facing surface provided by the wiring member and a second facing surface provided by the semiconductor element to form a bonding part and electrically connecting the wiring member to at least one of the main electrodes of the semiconductor element; and
    a plurality of wire pieces disposed in the bonding member, and fixed to the first facing surface to protrude from the first facing surface, wherein
    the wiring member includes a back-side wiring member disposed adjacent to the back surface of the semiconductor element and electrically connected to the back electrode,
    the bonding member includes a back-side bonding member that forms a back-side bonding part between the back electrode and the back-side wiring member,
    the back-side bonding member has, in a plan view in the plate thickness direction, a central region that overlaps with a central portion of the semiconductor element including an element center, and an outer peripheral region that includes a portion overlapping with an outer peripheral portion of the semiconductor element surrounding the central portion and surrounds the central region,
    the plurality of wire pieces include at least four wire pieces disposed in the outer peripheral region of the back-side bonding member at positions corresponding to at least four respective corners of the semiconductor element,
    the plurality of wire pieces include at least one wire piece disposed to extend toward the element center in the plan view,
    the plurality of wire pieces include at least one wire piece fixed to the first facing surface of the back-side wiring member in the back-side bonding part,
    the at least one wire piece fixed to the first facing surface of the back-side wiring member has a first end and a second end on a side adjacent to the back surface of the semiconductor element in the plate thickness direction, a fixed part disposed between the first end and the second end and fixed to the first facing surface of the back-side wiring member, and a non-fixed part that is continuous with the fixed part and is unfixed to the first facing surface of the back-side wiring member,
    the at least one wire piece fixed to the first facing surface of the back-side wiring member at the fixed part further has a flat part on the side adjacent to the back surface of the semiconductor element in the plate thickness direction, the flat part being parallel to the first facing surface of the back-side wiring member,
    the flat part is provided at least at the first end or the second end of the at least one wire piece and is in contact with the back surface of the semiconductor element, and
    the non-fixed part is provided at a position overlapping with the flat part in the plate thickness direction, and is separated from the first facing surface of the back-side wiring member.

2. The semiconductor device according to claim 1, wherein
    the wiring member includes a front-side wiring member disposed adjacent to the front surface of the semiconductor element and electrically connected to the front electrode,
    the bonding member includes a front-side bonding member that forms a bonding part between the front electrode and the front-side wiring member, and
    the plurality of wire pieces include a plurality of front-side wire pieces disposed in the front-side bonding member.

3. The semiconductor device according to claim 2, wherein
the front-side wire pieces in the front-side bonding member are disposed at positions different from the wire pieces disposed in the back-side bonding member in a direction perpendicular to the plate thickness direction of the semiconductor element.

4. The semiconductor device according to claim 2, wherein
the semiconductor element includes:
a gate pad disposed on the front surface;
a gate wiring disposed adjacent to the front surface and continuous with the gate pad; and
a gate wiring protection part disposed on the front surface as a part of a protective film protecting the gate wiring, and
in the front-side bonding member, the plurality of front-side wire pieces are disposed at positions without overlapping with the gate wiring protection part.

5. The semiconductor device according to claim 2, wherein
the front-side wiring member includes a first wiring member and a second wiring member that is connected to the front electrode via the first wiring member,
the front-side bonding member includes a first bonding member disposed adjacent to the front surface, and a second bonding member that forms a bonding part between the second wiring member and the first wiring member,
the front-side wire pieces include first front-side wire pieces disposed in the first bonding member, and second front-side wire pieces disposed in the second bonding member,
a number of the back-side wire pieces, a number of the first front-side wire pieces and a number of the second front-side wire pieces are different from each other, and
the number of the back-side wire pieces is the largest and the number of the second front-side wire pieces is the smallest.

6. The semiconductor device according to claim 2, wherein
at least one of the plurality of front-side wire pieces includes a first end and a second end on a side adjacent to the front surface of the semiconductor element in the plate thickness direction, a fixed part disposed between the first end and the second end and fixed to the first facing surface of the front-side wiring member, and a non-fixed part that is continuous with the fixed part and is unfixed to the first facing surface of the front-side wiring member,
the at least one of the plurality of front-side wire pieces further includes a flat part at least at one of the first end and the second end thereof, the flat part is parallel to the first facing surface of the front-side wiring member and is in contact with the front surface of the semiconductor element, and
the non-fixed part is provided at a position overlapping with the flat part in the plate thickness direction, and is separated from the first facing surface of the front-side wiring member.

7. The semiconductor device according to claim 1, wherein
the flat part is provided at each of the first end and the second end, and
the non-fixed part is located on each of opposite sides of the fixed part.

8. The semiconductor device according to claim 1, wherein
the at least four wire pieces disposed in the outer peripheral region of the back-side bonding member at positions corresponding to at least four respective corners of the semiconductor element are all provided by the at least one wire piece including the fixed part, the flat part and the non-fixed part, and
in each of the at least four wire pieces, the flat part is provided at least at one of the first end or the second end which is on a side further from the element center than the other.

9. The semiconductor device according to claim 1, wherein
the fixed part is at a position without overlapping with the flat part in the plate thickness direction.

* * * * *